(12) United States Patent
Eran et al.

(10) Patent No.: US 6,862,326 B1
(45) Date of Patent: Mar. 1, 2005

(54) WHITENING MATCHED FILTER FOR USE IN A COMMUNICATIONS RECEIVER

(75) Inventors: Alon Eran, Moshav Beit Elazary (IL); Ophir Shabtay, Haifa (IL); Alexander Kleinerman, Natania (IL); Ariel Zaltsman, Ra'anana (IL)

(73) Assignee: Comsys Communication & Signal Processing Ltd., Herzelia (IL)

( * ) Notice: Subject to any disclaimer, the term of this patent is extended or adjusted under 35 U.S.C. 154(b) by 787 days.

(21) Appl. No.: 09/789,438

(22) Filed: Feb. 20, 2001

(51) Int. Cl.[7] .................. H03D 1/00; H04D 27/06
(52) U.S. Cl. .................. 375/343; 375/229; 375/350
(58) Field of Search .................. 375/343, 229–233, 375/350, 285, 346, 348; 708/300, 314, 315, 322, 323, 400, 403, 404, 420

(56) References Cited

U.S. PATENT DOCUMENTS

| | | | |
|---|---|---|---|
| 4,701,936 A | 10/1987 | Clark et al. | 375/14 |
| 5,031,195 A | 7/1991 | Chevillat et al. | 375/14 |
| 5,307,374 A | 4/1994 | Baier | 375/11 |
| 5,481,565 A * | 1/1996 | Pal | 375/232 |
| 5,751,768 A | 5/1998 | Guglielmi et al. | 375/234 |
| 5,850,357 A | 12/1998 | Shefer | 364/825 |
| 6,026,121 A * | 2/2000 | Sadjadpour | 375/262 |
| 6,044,111 A | 3/2000 | Meyer et al. | 375/231 |
| 6,608,873 B1 * | 8/2003 | Spinnler et al. | 375/343 |

FOREIGN PATENT DOCUMENTS

EP         1032170        2/2000     ......... H04L/25/03

OTHER PUBLICATIONS

U.S. Appl. No. 09/616,161, filed Jul. 14, 2000, Yakhnich et al.

Han, Youngyearl, "On The Minimization of Overhead in Channel Impulse Response Measurement", IEEE Transactions on Vehicular Technology, vol. 47, No. 2, pp. 631–636, May 1998.

Khayrallah, A.S., et al., "Improved Channel Estimation With Side Information", IEEE, pp. 1049–1051, 1997.

Boss, Dieter, et al., "Impact of Blind Versus Non–Blind Channel Estimation on The BER Performance of GSM Receivers", IEEE Signal Processing Workshop on Higher–Order Statistics, pp. 62–66, Jul. 21–23, 1997.

Mehrotra, Asha, GSM System Engineering, Artech House Inc., 1997, pp. 160–245.

Haykin, Simon, "Adaptive Filter theory", Prentice Hall, 1996, pp. 483–535.

Gerstacker, Wolfgang H. et al., "Improved Equalization for GSM Mobile Communications", IEEE, Not dated.

(List continued on next page.)

Primary Examiner—Jean B. Corrielus
(74) Attorney, Agent, or Firm—Zaretsky & Associates PC; Howard Zaretsky

(57) ABSTRACT

A novel and useful whitening matched filter (WMF) for use in a communications receiver. The WMF is constructed by cascading a matched filter and a noise-whitening filter. The response of the matched filter is derived from the time reversed complex conjugate of the channel impulse response. The whitening filter is derived by extracting the minimum phase portion of the mixed phase channel impulse response using homomorphic deconvolution. The whitening filter is implemented using either an FIR or IIR filter adapted to process the data received before and after the training sequence using a minimum phase system in a direction in time opposite to that of the direction of corresponding data sample processing performed by the equalizer.

54 Claims, 8 Drawing Sheets

OTHER PUBLICATIONS

Hafeez, Abdulrauf, et al., "Decision Feedback Sequence Estimation for Unwhitned ISI Channels With Applications to Multiuser Detection", IEEE Journal on Selected Areas in Communication, vol. 16, No. 9, pp. 1785–1795, Dec. 1998.

Forney Jr., G. David, "The Viterbi Algorithm", pp. 268–278, Nov. 27, 1972.

Gerstacker, Wolfgang H., "Iterative Equalization With Adaptive Soft Feedback", IEEE, Not dated.

Balachandran, Krishna, et al., "Reduced Complexity Sequence Detection for Nonminimum Phase Intersymbol Interference Channels", IEEE Transactions on Information Theory, vol. 43, No. 1, pp. 275–280, Jan. 1997.

Oppenheim, Alan V., "Discrete–time Signal Processing", Prentice–Hall, Inc., 1989, pp. 781–787.

Gerstacker, Wolfgang, et al., "An Efficient Method for Prefilter Computation for Reduced–State Equalization", No dated.

Meyr, Heinrich, "Digital Communication Receivers: Synchronization, Channel Estimation and Signal Processing", John Wiley & Sons, 1998, pp. 701–707.

U.S. Appl. No. 09/789,439, entitled "Apparatus for and Method of Reducing Interference In a Communications Receiver", filed Feb. 20, 2001.

U.S. Appl. No. 09/754,566, entitled "Soft Decision Output Generator", filed Jan. 4, 2001.

* cited by examiner

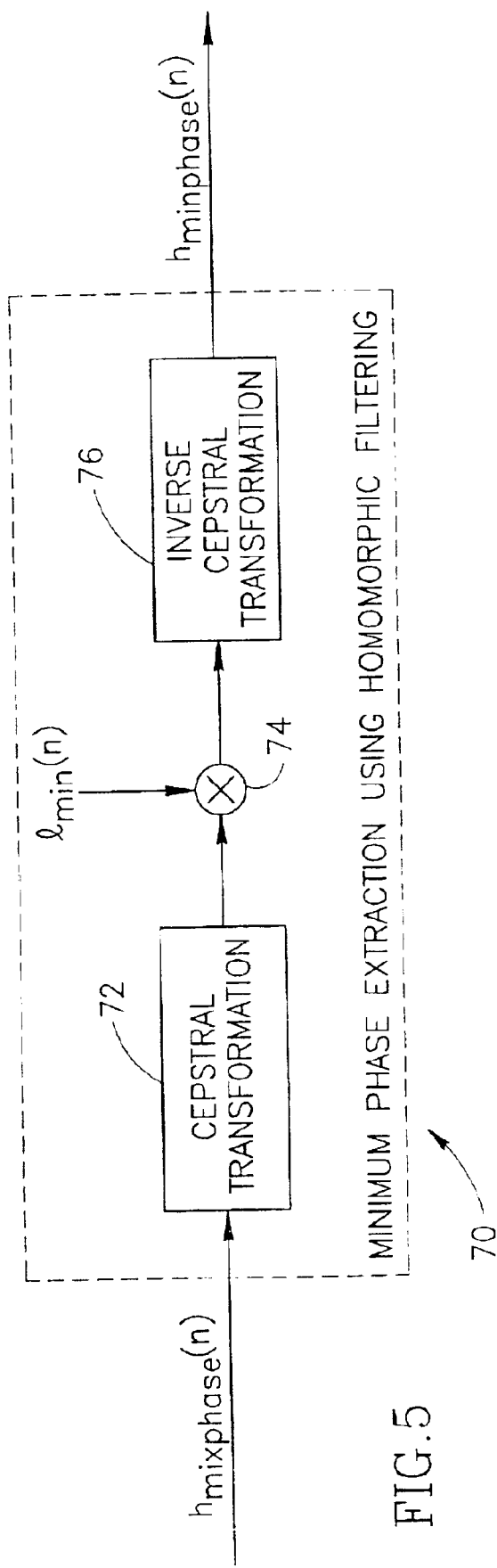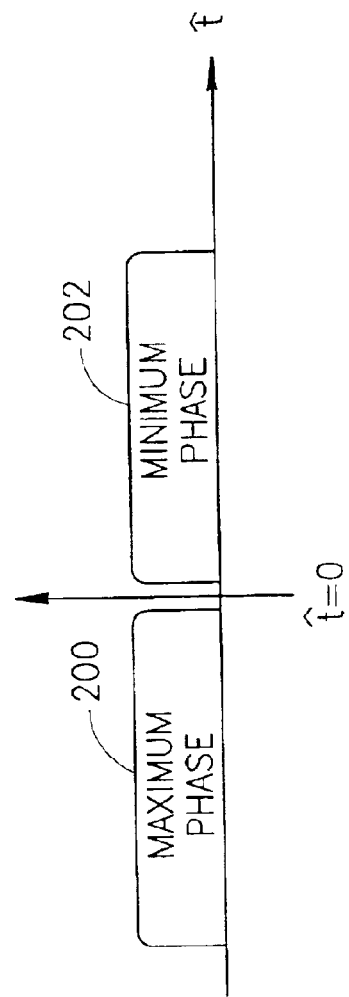

WHITENING MATCHED FILTER FOR USE IN A COMMUNICATIONS RECEIVER

REFERENCE TO RELATED APPLICATION

The subject matter of the present application is related to and may be advantageously combined with the subject matter of copending and commonly owned application U.S. application Ser. No. 09/616,161, to Yakhnich et al, filed Jul. 14, 2000, entitled "Method of Channel Order Selection and Channel Order Estimation in a Wireless Communication System," incorporated herein by reference in its entirety.

FIELD OF THE INVENTION

The present invention relates generally to communication systems and more particularly relates to a whitening matched filter and related method particularly suited for use as pre-processing for a non-linear channel equalizer in a digital communications receiver.

BACKGROUND OF THE INVENTION

In recent years, the world has witnessed explosive growth in the demand for wireless communications and it is predicted that this demand will continue to increase in the future. There are well over 500 million users that subscribe to cellular telephone services and the number is continually increasing. Eventually, in the not too distant future the number of cellular subscribers will exceed the number of fixed line telephone installations. Already, in many cases, the revenues from mobile services already exceeds that for fixed line services even though the amount of traffic generated through mobile phones is much less than in fixed networks.

Other related wireless technologies have experienced growth similar to that of cellular. For example, cordless telephony, two-way radio trunking systems, paging (one way and two way), messaging, wireless local area networks (WLANs) and wireless local loops (WLLs). In addition, new broadband communication schemes are rapidly being deployed to provide users with increased bandwidth and faster access to the Internet. Broadband services such as xDSL, short-range high-speed wireless connections, high rate satellite downlink (and the uplink in some cases) are being offered to users in more and more locations.

It is well known that the performance of a communications receiver operating over a fading channel (i.e. mobile radio channels, etc.) can be improved by the use of channel equalization which in turn can be improved by use of whitening matched filtering. In a conventional receiver structure the Intersymbol Interference (ISI) is mitigated by channel equalization. Schemes commonly employed to mitigate ISI include full maximum likelihood sequence estimation (MLSE), finite-length decision feedback equalization (DFE), maximum a posteriori (MAP) equalization, a type of MLSE equalization known as soft output Viterbi algorithm (SOVA) equalization, reduced state sequence estimation (RSSE) or any other suitable equalizer wherein the equalizer is preferably (or required to be in come cases) preceded by a whitening matched filter (WMF).

It is common for the WMF to be implemented as a cascade of the T/2 spaced channel matched filter, a decimator to symbol rate 1/T followed by a T-spaced whitening filter. The optimum matched filter in the case of AWGN or flat fading channels, in the sense that the decimated matched filter output is a sufficient statistic for symbol-by-symbol detection as rate 1/T, has been found to be the filter matched to the partial T-spaced transmitting pulse shape or the T/2-spaced pulse followed by a decimator to symbol rate 1/T. In the presence of ISI, the decimated output of the matched filter, matched to the channel by convolving the pulse shape with the channel impulse response, is also an optimal sufficient statistic for detection at rate 1/T. The matched filter, however, does not remove ISI but rather concentrates the maximal symbol energy in the correct sampling instance. The T-spaced whitening filter subsequently attempts to effectively cancel the noncausal precursor ISI by replacing the samples and channel by their minimal phase equivalents (See H. Meyr, "Digital Communication Receivers: Synchronization, Channel Estimation and Signal Processing," John Wiley & Sons, Inc., 1998, Section 13.3.4).

The performance of many equalization techniques commonly known and used today is sensitive to channel phase. For example, reduced state sequence estimation (RSSE) is a well-known equalization technique whose best performance is obtained for minimum phase channels. For non-minimum phase channels, the performance of a RSSE based equalizer may not be adequate. Channel estimation is aided, for example in GSM systems, by the insertion of a training sequence in the midamble of the burst. Equalization is then performed in different directions over the left and right data fields. Therefore, the effect on equalization of the minimum phase part of the channel response in one direction is equivalent to the effect on equalization of the maximum phase in the other direction. It is well known that the RSSE equalization performs poorly in non-minimal phase conditions.

Thus, the use of a WMF is beneficial, if not critical, to the performance of a communications receiver structure that incorporates the above mentioned equalization technique, especially RSSE type equalization techniques, and that is intended to operate with fading channels such as mobile radio channels, cellular, broadband, etc. described above.

A drawback of the above described mobile radio system is the computational complexity involved in determining the transfer functions of the matched filter and whitening filter components of the WMF. Most prior art techniques implement the whitening filter as a FIR filter (i.e. moving average or MA type filter) which requires very long tap lengths to achieved adequate performance. Other prior art approaches employ open-ended iterative search techniques to determine the FIR filter coefficients. The computational requirements of these open-ended iterative search techniques cannot be predicted.

It is desirable, therefore, to have a technique for determining the matched filter response and the whitening filter response of a WMF that has low computational complexity and involves a constant number of computations.

SUMMARY OF THE INVENTION

Accordingly, the present invention provides a novel and useful whitening matched filter (WMF) for use in a communications receiver. The present invention is suitable for use in communications receivers that may be coupled to a wide range of channels and is particularly useful in improving the performance in GSM based communication systems and other types of digital communications schemes especially those that utilize a midamble training sequence. The messages including the training sequence are typically affected by channels characterized by fading with rapidly changing impulse response. The whitening matched filter of the present invention is operative to compensate for the coloration potentially added by the transmit pulse shaping filter, channel distortion including multipath propagation and fading, receive filter and any pre-channel estimation filtering. The WMF functions to whiten (i.e. decorrelate) the colored noise in the received signal.

To aid in illustrating the principles of the present invention, the apparatus and method are presented in the context of a GSM mobile station. It is not intended that the scope of the invention be limited to the examples presented herein. One skilled in the art can apply the principles of the present invention to numerous other types of communication systems as well.

The present invention implements a whitened matched filter which is used as a pre-filter for a nonlinear equalizer in a communications receiver. The equalizer may comprise any suitable nonlinear equalizer including but not limited to maximum likelihood sequence estimation (MLSE), decision feedback equalizer (DFE), reduced state sequence estimation (RSSE), decision feedback sequence estimation (DFSE), etc. The WMF can be implemented in hardware and is also suitable for implementation entirely in software wherein all processing of the input signal is performed in the digital domain.

The WMF of the present invention comprises a matched filter concatenated with a whitening filter. The response of the matched filter is the time-reversed complex conjugate of the channel impulse response. The WMF is adapted to filter the received samples such that they effectively have passed through a minimum phase channel. This is achieved by processing the received samples through a filter (in cascade with an appropriate matched filter) whose transfer function is the inverse of the minimum phase response of the channel, wherein the input samples are processed in reverse time order relative to the processing by the equalizer. This effectively cancels the non-minimum phase portions of the received signal.

The minimum phase channel impulse response may be derived using any suitable technique. A technique utilizing homomorphic deconvolution is disclosed to illustrate one technique for generating the required filter response. In particular, the invention implements all the computations necessary to generate an autoregressive moving average (ARMA) T-spaced filter based on a given FIR channel impulse response. The FIR channel impulse response can be determined in any suitable manner but is commonly derived by solving a set of Yule-Walker equations for a known transmitted sequence (i.e. a training sequence such as transmitted as a midamble in a GSM burst).

In the example embodiment presented below, the response of the noise-whitening filter is derived by extracting the minimum phase sequence of the mixed phase channel impulse response using homomorphic deconvolution. The channel impulse response sequence can be represented as a mixed combination of a minimum phase sequence and a maximum phase sequence. Homomorphic deconvolution is used to separate the minimum phase sequence from the mixed phase sequence.

Homomorphic deconvolution is performed using cepstral transformations. First, the cepstral transform is performed to convert the channel impulse response from the discrete time domain into the cepstral domain where the deconvolution can take place due to cepstral domain properties of mixed-phase signals. Note that filtering in the cepstral domain is commonly referred to as 'liftering.' A minimum phase decomposition is then performed by applying a Hilbert transform lifter to the signal so as to preserve only the minimum phase portion. The liftered cepstral domain signal is then converted back to the discrete time domain using a inverse cepstral transform.

The advantages of the WMF filtering techniques of the present invention, in particular performing the filter processing in reverse time relative to the equalizer processing, include the following. A key advantage is that filtering utilizing $1/H_{max}$ (which is not stable) in the causal direction can effectively be achieved by filtering using $1/H_{min}$ in the anti-causal direction. In addition, the process has lower computational complexity due to fewer complex operations required, thus requiring less MIPs for the same performance. The process permits use of IIR or FIR filters with IIR filters being advantageous by requiring less memory and CPU cycles due to a fewer number of taps and being easier to compute.

The extraction of the minimum phase sequence using homomorphic deconvolution for the filter response of the noise-whitening filter has the advantages of lower complexity involving a constant number of computations as opposed to one of the prior art iterative search methods. The WMF of the invention implements T-spaced filtering as opposed to fractional-spaced pre-filtering.

The WMF implements an ARMA pre-filter which is a lower complexity filter implementation as opposed to FIR pre-filtering. This is because an FIR pre-filter implementation would demand a much higher order filter to achieve similar performance. The WMF of the present invention comprises an all digital matched filter and noise-whitening filter as opposed to prior art implementations that use an analog matched filter cascaded with a digital noise-whitening filter. The WMF greatly benefits the nonlinear equalizer located subsequent to the WMF in the signal processing path by providing a minimum phase signal for non-MLSE type equalizers and noise-whitening for all equalizer types.

In addition, prior art implementations of WMF have matched filter components that are fixed. They are also matched a priori to known criteria, e.g., the pulse shaping filter in the transmitter, etc. In contrast, the WFM filter of the present invention is dynamic whereby the entire channel impulse response, including transmit filter, receive filter and channel impulse response, is matched dynamically, on the fly, as the various segments of the signal propagation path change over from one transmission burst to the next, i.e. the transmit filter, channel, receive filter, etc.

Many aspects of the previously described invention may be constructed as software objects that execute in embedded devices as firmware, software objects that execute as part of a software application on a computer system running an operating system such as Windows, UNIX, LINUX, etc., an Application Specific Integrated Circuit (ASIC), Field Programmable Gate Array (FPGA) or functionally equivalent discrete hardware components.

There is therefore provided in accordance with the present invention a method of whitening matched filtering a plurality of received samples in a receiver coupled to a channel having a mixed phase channel impulse response, the receiver employing an equalizer adapted to subsequently compensate the received samples for distortion encountered in the channel, the method comprising the steps of generating a whitening matched filter transfer function that includes a minimum phase channel impulse response and a matched filter response derived from the mixed phase channel impulse response and processing the received samples in accordance with the whitening matched filter transfer function in reverse time order with respect to processing performed by the equalizer.

There is also provided in accordance with the present invention a method of whitening matched filtering a plurality of received samples received over a channel, the channel having a mixed phase channel impulse response, the method comprising the steps of generating a whitening matched filter transfer function that includes a minimum phase channel impulse response and a matched filter response, the minimum phase channel impulse response derived from the mixed phase channel impulse response in accordance with homomorphic deconvolution employing cepstral transformation techniques, processing the received samples in accordance with the whitening matched filter transfer function in reverse time order with respect to processing performed by the equalizer, processing samples received before a known training sequence in accordance with the whitening matched filter transfer function in forward time order and processing samples received after the known training sequence in accordance with the minimum phase channel impulse response in reverse time order.

There is further provided in accordance with the present invention a method of whitening matched filtering an input signal received over a channel, the channel having a mixed phase channel impulse response, the method comprising the steps of generating a whitening matched filter transfer function of the form $$H_{WMF}(z) = \frac{H_{MF}(z)}{H_{WF}(z)}$$

that includes a matched filter response concatenated with a whitening filter response that includes a minimum phase channel impulse response, the minimum phase channel impulse response derived from the mixed phase channel impulse response, the matched filter response derived from the time reversed complex conjugate of the channel impulse response expressed in the equation $h_{MF}(t)=h^*_{CIR}(-t)$, wherein matched filtering is performed in the anti-causal direction on the input signal and processing the received samples using a filter with the whitening matched filter transfer function in reverse time order with respect to equalizer processing subsequently performed on received samples.

There is also provided in accordance with the present invention a whitening matched filter for generating an output signal in response to an input signal received over a channel having a mixed phase channel impulse response comprising means for generating a whitening matched filter transfer function including a matched filter response and a minimum phase channel impulse response derived from the mixed phase channel impulse response and a filter processing system adapted to process received samples in accordance with the whitening matched filter in reverse time order with respect to equalizer processing subsequently performed on the output of the whitened matched filter.

There is still further provided in accordance with the present invention a communications receiver for receiving and decoding an M-ary signal transmitted over a channel having a mixed phase channel impulse response comprising a radio frequency (RF) front end circuit for receiving and converting the M-ary transmitted signal to a baseband signal, a demodulator adapted to receive the baseband signal and to generate a received signal therefrom in accordance with the M-ary modulation scheme used to generate the transmitted signal, a whitening matched filter for generating an output signal in response to the receive signal, the whitening matched filter implemented using a processor comprising software means operative to: generate a whitening matched filter transfer function including a matched filter response and a minimum phase channel impulse response derived from the mixed phase channel impulse response using cepstral transformation techniques, process samples received over the channel before a known training sequence in accordance with the minimum phase channel impulse response in reverse time order with respect to processing performed by the equalizer on the samples received before the known training sequence and the equalizer adapted to equalize the output of the whitening filter so as to generate a sequence of hard symbol decisions therefrom.

There is also provided in accordance with the present invention a computer readable storage medium having a computer program embodied thereon for causing a suitably programmed system to perform whitening matched filtering on an input signal received over a channel having a mixed phase channel impulse response by performing the following steps when such program is executed on the system: generating a first matched filter response of the matched filter for non time reversed samples of the input signal derived from the time reversed complex conjugate of the channel impulse response expressed as $h_{MF}(t)=h^*_{CIR}(-t)$, generating a second matched filter response of the matched filter for time reversed samples of the input signal derived from the time reversed complex conjugate of the channel impulse response expressed as $h_{MF}(t)=h^*_{CIR}(t)$ and processing received samples in accordance with the minimum phase channel impulse response derived from the mixed phase channel impulse response in reverse time order with respect to equalizer processing of the received samples.

BRIEF DESCRIPTION OF THE DRAWINGS

The invention is herein described, by way of example only, with reference to the accompanying drawings, wherein:

FIG. 5 is a block diagram illustrating the extraction of the minimum phase sequence of the channel impulse response using homomorphic deconvolution;

FIG. 6 is a diagram illustrating the maximum and minimum phase parts of the channel impulse response in the cepstral domain;

DETAILED DESCRIPTION OF THE INVENTION

Notation Used Throughout

Figure 1:
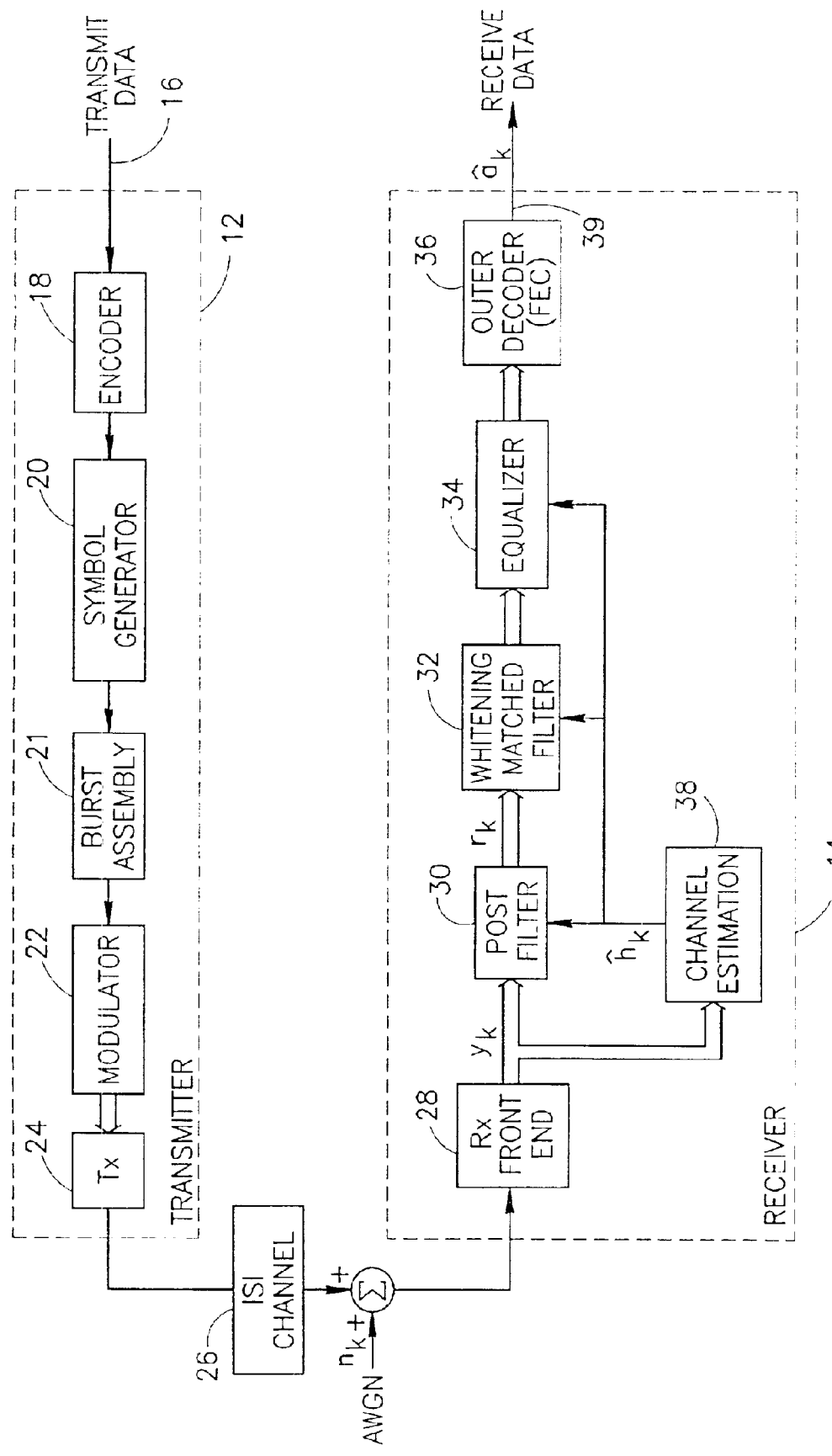
FIG. 1 is a block diagram illustrating an example communication system employing an inner and outer encoder in the transmitter, inner and outer decoding stages in the receiver and the whitened matched filter of the present invention.

The following notation is used throughout this document.

| Term | Definition |
| --- | --- |
| ARMA | Auto Regressive Moving Average |
| ASIC | Application Specific Integrated Circuit |
| AWGN | Additive White Gaussian Noise |
| BER | Bit Error Rate |
| CDMA | Code Division Multiple Access |
| CIR | Channel Impulse Response |
| CPU | Central Processing Unit |
| CRC | Cyclic Redundancy Check |
| DFE | Decision Feedback Equalizer |
| DFT | Discrete Fourier Transform |
| DSL | Digital Subscriber Line |
| DSP | Digital Signal Processor |
| EDGE | Enhanced Data rates for GSM and TDMA/135 Evolution |
| EEROM | Electrically Erasable Read Only Memory |
| EGPRS | Enhanced General Packet Radio System |
| FFT | Fast Fourier Transform |
| FIR | Finite Impulse Response |
| FPGA | Field Programmable Gate Array |
| GERAN | GSM EDGE Radio Access Network |
| GMSK | Gaussian Minimum Shift Keying |
| GSM | Global System for Mobile Communication |
| IDFT | Inverse Discrete Fourier Transform |
| IEEE | Institute of Electrical and Electronic Engineers |
| IFFT | Inverse Fast Fourier Transform |
| IIR | Infinite Impulse Response |
| ISDN | Integrated Services Digital Network |
| ISI | Intersymbol Interference |
| MA | Moving Average |
| MAP | Maximum A Posteriori |
| MLSE | Maximum Likelihood Sequence Estimation |
| PSK | Phase Shift Keying |
| RAM | Random Access Memory |
| ROM | Read Only Memory |
| RSSE | Reduced State Sequence Estimation |
| SNR | Signal to Noise Ratio |
| SOVA | Soft Output Viterbi Algorithm |
| TDMA | Time Division Multiple Access |
| VA | Viterbi Algorithm |
| WLAN | Wireless Local Area Network |
| WLL | Wireless Local Loop |
| WMF | Whitening Matched Filter |

Detailed Description of the Invention

The present invention is a whitening matched filter (WMF) for use in a communications receiver. The present invention is suitable for use in communications receivers that may be coupled to a wide range of channels and is particularly useful in improving the performance in GSM and other types of cellular and mobile radio channels. Examples of mobile radio systems include cellular communications systems, including global systems for mobile communications (GSM), CDMA, TDMA, etc. Other wireless communications systems that can benefit from the present invention include paging communication devices, cordless telephones, telemetry systems, etc. These types of channels are typically characterized by fading and multipath propagation with rapidly changing impulse response. The whitening matched filter of the present invention is operative to compensate for the coloration potentially added by the transmit pulse shaping filter, channel distortion including multipath propagation and fading, receive filter and any pre-channel estimation filtering.

For illustration purposes, the invention is described in the context of a GSM EDGE mobile radio station. Note, however, that it is not intended that the invention be limited to the example presented herein. It is appreciated that one skilled in the art can apply the principles of the invention to other communications systems (wireless or not).

A block diagram illustrating an example communication system employing an inner and outer encoder in the transmitter, inner and outer decoding stages in the receiver and the whitened matched filter of the present invention is shown in FIG. 1. The communication system, generally referenced 10, comprises a concatenated encoder transmitter 12 coupled to a time-varying, time-dispersive additive white Gaussian noise (AWGN) channel (shown as an ISI channel 26 with AWGN added), and a concatenated decoder receiver 14. The transmitter comprises a channel encoder 18, optional interleaver (not shown), bit to symbol mapper (symbol generator) 20, message (i.e. burst) assembly 21, modulator 22 and transmit circuit 24 which includes a transmit pulse shaping filter.

Input data bits 16 to be transmitted are input to the encoder which may comprise an error correction encoder such as Reed Solomon, convolutional encoder, parity bit generator, etc. The encoder functions to add redundancy bits to enable errors in transmission to be located and fixed.

The bits output of the encoder are then input to an optional interleaver which functions to rearrange the order of the bits in order to more effectively combat burst errors in the channel. The rearrangement of the bits caused by interleaving improves the resistance to burst errors while adding latency and delay to the transmission.

The bits output of the interleaver are then mapped to symbols by the symbol mapper. The bit to symbol mapper functions to transform bits to modulator symbols from an M-ary alphabet. For example, an 8-PSK modulator converts input bits into one of eight symbols. Thus, the mapper in this case generates a symbol for every three input bits.

The symbols output from the mapper are input to the modulator which functions to receive symbols in the M-ary alphabet and to generate an analog signal therefrom. The transmit circuit amplifies, filters and modulates this signal into the desired frequency band before transmitting it over the channel. Upconversion is necessary for transmission over wireless channels. The transmit circuit comprises coupling circuitry required to optimally interface the signal to the channel medium.

In the example presented herein, the channel is a mobile radio channel that suffers from multipath propagation which causes frequency selective fading and ISI (time dispersion). Examples include cellular, cordless, fixed wireless channel, e.g. satellite. The channel may also comprise a wired channel, for example xDSL, ISDN, Ethernet, etc. In all cases, it is assumed that AWGN is added to the signal in the channel. The transmitter is adapted to generate a signal that can be transmitted over the channel so as to provide robust, error free detection by the receiver.

It is noted that both the inner and outer decoders in the receiver have complimentary encoders in the transmitter. The outer encoder in the transmitter comprises the encoder, e.g., convolutional, etc. The inner encoder comprises the channel itself, which can be modeled as an L-symbol long FIR-type channel.

At the receiver, the analog signal from the channel is input to Rx front end circuitry 28 which demodulates and samples the received signal to generate complex I and Q received samples $y_k$. The complex samples are stored in a memory buffer, e.g., a RAM buffer, for access by the various processing blocks in the receiver, e.g., channel estimation, post sampling filter, WMF, equalizer, etc. The equivalent discrete time model for the received symbol at the $k^{th}$ sampling instant is given by $$y_k = \sum_{i=d}^{l} h_l a_{k-i} + n_k \quad (1)$$

where $y_k$ represents the $k^{th}$ received sample;

$a_{k-i}$ represents the k-$i^{th}$ data symbol;

$h_i$ represents the impulse response of the channel (i.e. the channel estimate);

$n_k$ represents the zero mean additive white Gaussian noise (AWGN) component.

The symbols are then optionally filtered using a post sampling filter in accordance with an optional detection mechanism which is operative to determine whether the received signal can benefit from some form of compensation to compensate for interference noise present in the receive signal. The output of the post sampling filter comprises the complex samples $r_k$. Modern receivers comprise a rejection filter in the Rx front end section commonly called the receive filter. The receive filter functions to reject out-of-band noise, e.g., thermal, etc. The effect of the transmit pulse shaping filter, ISI channel and receive filter is to color the noise. The receiver therefore employs a filter 32, known as a whitening matched filter (WMF) that is matched to the cascade of the transmit pulse shaping filter, the ISI channel impulse response and the receive filter.

In accordance with the present invention, the WMF comprises two cascaded filter responses: a matched filter response and a noise-whitening filter response. The noise-whitening filter response used is minimum phase which is derived using homomorphic deconvolution of the mixed phase channel impulse response. The WMF of the present invention is described in more detail hereinbelow.

The complex samples output of the WMF are subsequently processed by the inner decoder which comprises an equalizer which compensates for the ISI caused by the delay and time spreading of the channel. The function of the equalizer is to attempt to detect the symbols that were originally transmitted by the modulator. It has been found that the performance of the equalizer is improved when it receives a signal wherein the noise comprises white noise as opposed to correlated noise.

Note that a conventional equalizer adapted to output either soft or hard symbol decisions may be used. Examples of suitable equalizers include Maximum Likelihood Sequence Estimation (MLSE) based equalizers utilizing the well known Viterbi Algorithm (VA), linear equalizers, Decision Feedback Equalizer (DFE), Reduced State Sequence Estimation (RSSE) based equalizers, Decision Feedback Sequence Estimation (DFSE) based equalizers, etc. For equalizers that output hard decisions, soft decisions must subsequently be generated from the hard decisions. Examples of soft output type equalizers include Soft Output Viterbi Algorithm (SOVA) type equalizers and equalizers based on the more computationally expensive Maximum A Posteriori (MAP) algorithm.

A soft symbol generator suitable for use with the present invention is described in detail in U.S. Pat. No. 6,731,700, to Yakhnich et al., entitled "Soft Decision Output Generator," incorporated herein by reference in its entirety.

Equalization is a well known technique used to combat intersymbol interference whereby the receiver attempts to compensate for the effects of the channel on the transmitted symbols. An equalizer attempts to determine the transmitted data from the received distorted symbols using an estimate of the channel that caused the distortions. In communications systems where ISI arises due to partial response modulation or a frequency selective channel, a maximum likelihood sequence estimation (MLSE) equalizer is optimal. This is the form of equalizer generally used in GSM systems.

The MLSE technique is a nonlinear equalization technique which is applicable when the radio channel can be modeled as a Finite Impulse Response (FIR) system. Such a FIR system requires knowledge of the channel impulse response tap values. The channel estimate is obtained using a known training symbol sequence to estimate the channel impulse response. Most equalization techniques, such as DFE or linear equalization, and other processing blocks in the receiver such as the post sampling filter and WMF require a precise estimate of the channel.

The soft decisions are subsequently input to a de-interleaver (not shown) if interleaving was employed at the transmitter. The de-interleaver is operative to reconstruct the original order of the bits input to the transmitter. The de-interleaved soft bit values are subsequently input to the outer decoder which functions to locate and fix errors using the redundancy inserted by the encoder in the transmitter. The outer decoder generates the binary receive data $\hat{a}_k$ 39.

The outer decoder is a soft decoder, i.e. it takes soft bit values as input, which functions to detect and correct errors using the redundancy bits inserted by the encoder. The outer decoder generates the binary receive data utilizing the soft bit input. Examples of the outer decoder include turbo decoders, convolutional forward error correction decoders utilizing the Viterbi Algorithm, etc. This class of decoders provides better performance by taking into account soft information about the reliability of the received symbol. Soft decision Viterbi decoders have the advantage of efficiently processing soft decision information and providing optimum performance in the sense of minimum sequence error probability.

Note that the Viterbi algorithm is widely used in communication systems and has been adapted to perform functions including demodulation, decoding, equalization, etc. Many systems utilize the Viterbi Algorithm in both the inner and outer decoding stages.

Channel estimation is one of the most significant operations performed by the receiver. The channel estimate is used by several critical processing blocks in the receiver. Thus, the performance of the receiver cannot be optimal without the availability of an accurate estimate of the channel. An estimate of the channel is generated from the received signal after it is passes through an initial receive filter in the receiver front end circuit. The channel estimation 38 is operative to generate a channel estimate $\hat{h}_k$ that is generated using the received input samples $y_k$ and a training sequence $f_k$.

Several methods of channel estimation that are known in the art and suitable for use with the present invention include, for example, a correlation method and a least squares method. The correlation method is described in detail in "GSM System Engineering," A. Mehrotra, 1997, Chapter 6 and in the article "On the Minimization of Overhead in Channel Impulse response Measurement," Y. Han, IEEE Transactions on Vehicular Technology, Vol. 47, No. 2, May 1998, pages 631–636. The least square method of channel estimation is described in more detail in the articles "Improved Channel Estimation With Side Information," A. S. Khayrallah, R. Ramesh, G. E. Bottomley, D. Koilpillai, IEEE, March 1997, pages 1049–1051 and "Impact of Blind versus Non-Blind Channel Estimation on the BER Performance of GSM Receivers," D. Boss, T. Petermann, K. Kammeyer, IEEE Signal Processing Workshop on Higher-Order Statistics, Jul. 21, 1997, pages 62–67 and in the book "Adaptive Filter Theory," S. Haykin, 1996, Chapter 11: Method of Least Squares.

Another channel estimation technique suitable for use with the present invention is described in U.S. application Ser. No. 09/616,161 in Yakhnich et al., filed Jul. 14, 2000, entitled "Method of Channel Order Selection and Channel Order Estimation in a Wireless Communication System," similarly assigned and incorporated herein by reference in its entirety.

Whitening Matched Filter

As described previously, the fading model of a wireless communication channel can be represented at any point in time as a FIR filter. If the FIR filter response has zeros outside the unit circle in the z-plane, the channel is non-minimum phase. Note that the impulse response of a system is a minimum phase sequence if the zeros of the corresponding transfer function lie inside the unit circle in the z-plane. The time domain property of such a sequence is depicted in Equation 2 which is referred to as the minimum energy delay property. The impulse response of a system, on the other hand, is a maximum phase sequence if the zeros of the corresponding transfer function all lie outside the unit circle.

The performance of non-linear equalizers is improved if the received samples have passed through a minimum phase channel due to the minimum energy delay property of such channels as expressed below.

$$\sum_{m=0}^{n} |h(m)|^2 \leq \sum_{m=0}^{n} |h_{\min}(m)|^2 \ \forall \ \{|H(z)| = |H_{\min}(z)|, n\} \quad (2)$$

where h(m) is the impulse response sequence for an arbitrary channel having the minimal energy delay property;

H(z) is the z-transform of h(m);

$h_{min}$(m) is the impulse response sequence of the minimum phase version of a channel;

$H_{min}$(z) is the z-transform of $h_{min}$(m);

n is an arbitrary length the impulse response is truncated to, making the channel model a FIR model.

The minimum energy delay property ensures that for all impulse responses h(m) belonging to the family of systems that have the same magnitude of transfer function, the partial energy of the impulse response sequence is mostly concentrated around n=0, meaning that the energy of the signal is the least delayed. In other words, this implies that the energy of the first few coefficients is generally larger than the rest of the coefficients.

An advantage of a minimum phase channel is that it enables the lowest equalizer complexity and improves the performance of many types of equalizers, in particular RSSE based equalizers. Equalizer complexity grows significantly for nonminimum phase channels. Thus, it is desirable that the equalizer sees a minimum phase channel.

In order to achieve a minimum phase channel, whitening matched filtering is performed on the received samples. The WMF is an all pass filter that functions to cancel the roots outside the unit circle in the z-plane while maintaining the magnitude of the original transfer function. The WMF of the present invention is constructed by concatenating a matched filter with a whitening filter.

Figure 2:
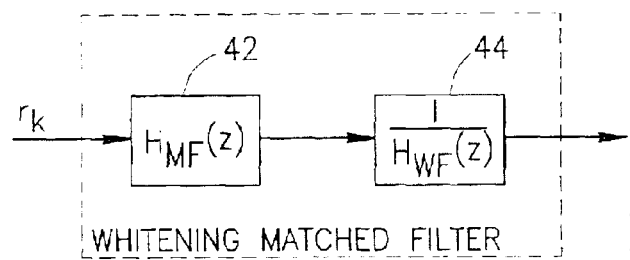
FIG. 2 is a block diagram illustrating the transfer function representation of the components of the whitening matched filter of the present invention.

A block diagram illustrating the transfer function representation of the components of the whitening matched filter of the present invention is shown in FIG. 2. The WMF, generally referenced 40, is constructed from the cascade of two filters: a matched filter 42 having a transfer function $H_{MF}$(z) (expressed as a z-transform) and a noise-whitening filter 44 having a transfer function 1/$H_{WF}$(z).

Consider that the channel impulse response can be represented as a mixed combination of a maximum phase sequence and a minimum phase sequence. The minimum phase sequence corresponding to zeros inside the unit circle and the maximum phase sequence corresponding to zeros outside the unit circle. The desired minimum phase output signal can be obtained by filtering out the maximum phase portion of the mixed phase signal. This is achieved using a filter having a transfer function with poles outside the unit circle at the same locations it is desired to cancel zeros. The inverse of a system filter whose transfer function contains zeros outside the unit circle at the desired pole locations can be used. Such a system filter can be obtained from the maximum phase portion of the channel impulse response.

Figure 3:
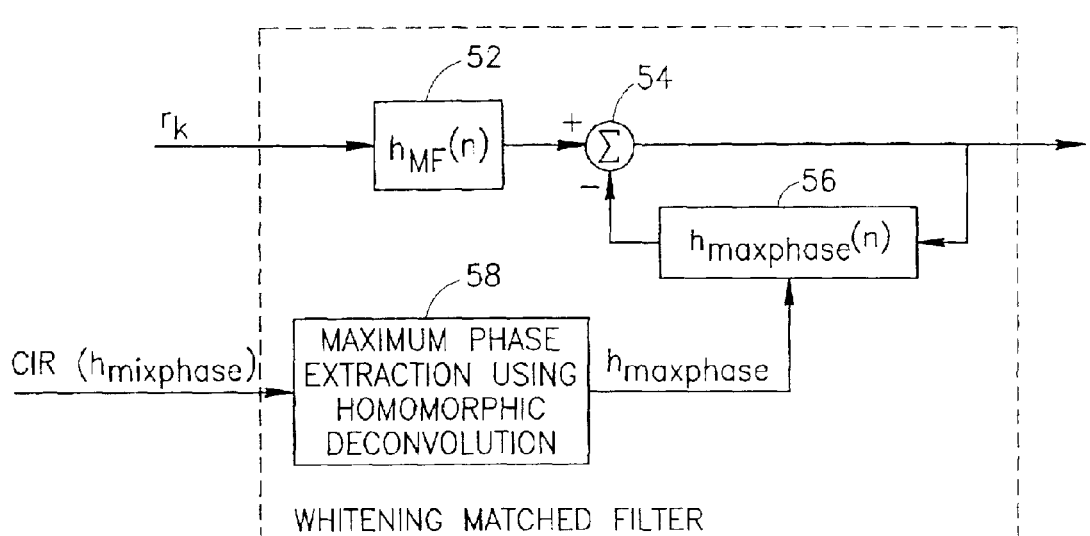
FIG. 3 is a block diagram illustrating the discrete time domain filter response of the whitening matched filter where the noise-whitening filter response is a maximum phase response.

A block diagram illustrating the discrete time domain filter response of the whitening matched filter where the noise-whitening filter response is a maximum phase response is shown in FIG. 3. The whitening matched filter, generally referenced 50, comprises the feedback configuration of the frequency response $h_{MF}$(n) 52 cascaded with the inverse frequency response $h_{MaxPhase}$(n) 56 using subtractor 54. The maximum phase extraction block 58 functions to perform homomorphic deconvolution on the mixed phase channel impulse response and is operative to output the maximum phase portion of the response. The maximum phase portion is then used to derive the maximum phase filter 56 used to filter the received signal. The goal being to process the received samples in such a way that they effectively passed through a minimum phase channel.

Thus, the desired filtering can be achieved by WMF 50 wherein inverse filtering is used with a maximum phase filter (resulting in poles outside the unit circle in place of the zeros) to cancel out the zeros outside the unit circle in the received signal. A problem is that the poles corresponding to the inverse of the maximum phase filter lie outside the unit circle, thus making the filter unfeasible in terms of stability, since the filter's transfer function $$\frac{1}{H_{MaxPhase}(z)}$$

contains poles outside the unit circle. From filter theory, it is well known that a causal, linear time-invariant filter is stable if and only if all the poles of the filter's transfer function lie inside the unit circle in the z-plane. If such a maximum phase filter were built, it is likely to diverge immediately and thus cannot be used for filtering.

In accordance with the invention, the stability problem of the filter structure described above is overcome by using the minimum phase channel impulse response as the regressive portion of the filter and filtering the received signal in the anti-casual direction. Inverse filtering in this manner effectively replaces the zeros of the minimum phase filter inside the unit circle with poles which are not inside the unit circle. Reversing time effectively swaps the zeros inside the unit circle of the received signal with the zeros outside the unit circle. The filtering process cancels out the zeros inside the unit circle and after undoing the time reversal, the zeros that were originally inside the unit circle remain and the zeros outside the unit circle are canceled, thus achieving the desired effect.

Minimum Phase ARMA Filter

A technique for determining the minimum phase filter involves calculating the zeros of the channel impulse response, sorting them into maximum and minimum phase (i.e. inside or outside the unit circle) and then reconstructing the transfer function to include only the minimum phase zeros (inside the unit circle). This technique, however, is not practical because determining the zeros of the channel impulse response (1) is not trivial and requires an iterative search algorithm, (2) does not involve a closed set of possibilities, (3) may result in an indeterminate solution that requires very long processing times to complete, if possible at all. Other techniques also involve heavy computational complexity such as performing matrix inversions.

Figure 4:
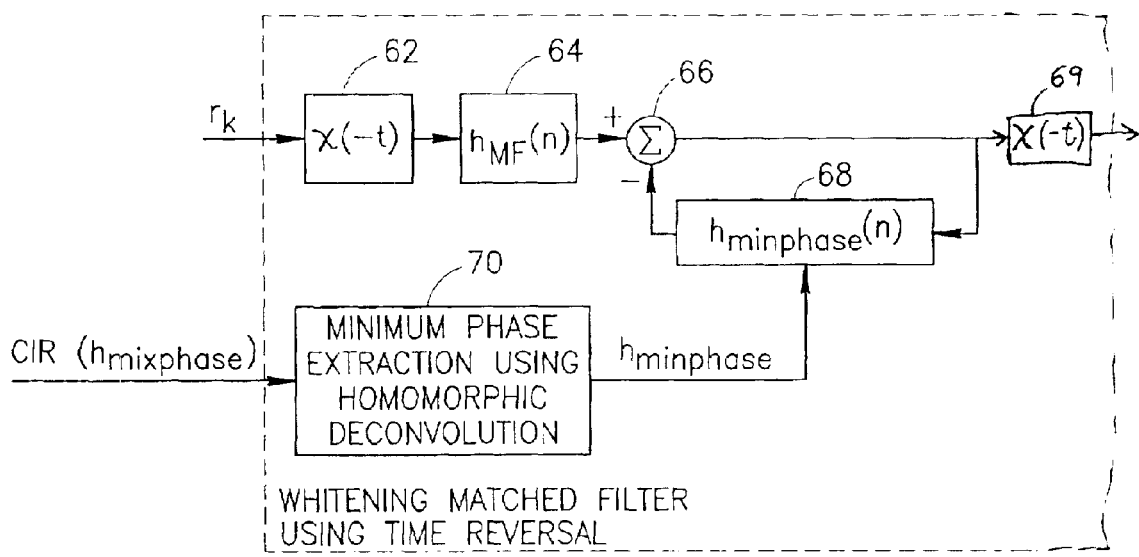
FIG. 4 is a block diagram illustrating the whitening matched filter using time reversal and a minimum phase noise-whitening filter response.

A block diagram illustrating the whitening matched filter using time reversal and a minimum phase noise-whitening filter response is shown in FIG. 4. The WMF using time reversal, generally referenced 60, comprises a time reversal block x(−t) 62, matched filter response $h_{MF}$(n) 64, $h_{MinPhase}$(n) 68, a second time reversal block x(−t) 69 and a minimum phase extraction block 70.

It is noted that the implementation of the minimum phase filter 68 is of the type known as an Auto Regressive Moving Average (ARMA) filter of the form $$H_{WMF}(z) = \frac{H_{MF}(z)}{H_{MinPhase}(z)} \quad (3)$$

where $H_{MF}(z)$ and $H_{MinPhase}(z)$ are the z-transforms of $h_{MF}$(n) and $h_{MinPhase}$(n) 68, respectively, and the signal block is filtered in the anti-causal direction.

It is important to note that the time reversals of WMF 60 are relative to the time related processing direction of the equalizer. Positive time relative to the WMF corresponds to the forward time direction of processing by the equalizer. Thus, time reversal in the WMF implies filtering in the direction opposite that to equalizer processing.

A technique for determining the coefficients of the ARMA filter from a given channel impulse response that is represented as a time limited complex valued series is presented. The coefficients of the ARMA filter are generated from the channel impulse response using the well known technique of homomorphic deconvolution whereby the minimum phase portion of the channel impulse response is extracted by a process known as 'liftering' in the 'cepstral' domain, as described in detail hereinbelow.

It is noted that an advantage of using an ARMA filter in the WMF filter and associated technique of the present invention over other types of filters such as FIR filters, is that the ARMA filter requires reduced computational complexity for the same spectral response. In contrast, an FIR filter requires a much longer length (i.e. additional taps) to provide the same spectral response. Another major advantage is that inverse filtering, i.e. $1/H_{max}$, is performed in the non-causal direction, to achieve the same effect as forward filtering, i.e. $1/H_{min}$, in the causal direction.

The extraction block 70 functions to perform the homomorphic deconvolution on the mixed phase CIR and is operative to output the minimum phase portion of the response. The minimum phase portion is then used to derive the minimum phase filter 68 used to all pass filter the received signal.

The channel impulse response (CIR) is considered to comprise the overall response of the following factors along the signal path: transmit filter, fading channel propagation path response, receive filter and any post-filtering done before channel estimation is performed, for example channel equalization or interference suppression.

As is well known in the art, the optimum white-noise optimized matched filter impulse response can be expressed as $$h_{MF}(t) = h_{CIR}*(-t) \quad (4)$$

where $h_{CIR}$(t) is the time limited series of the channel impulse response;

* represents the complex conjugate.

Note that it is assumed that the channel impulse response $h_{CIR}$(t) is provided by the channel estimate block 38 (FIG. 1).

Extraction of the Minimum Phase Sequence Using Homomorphic Deconvolution

A block diagram illustrating the extraction of the minimum phase sequence of the channel impulse response using homomorphic deconvolution is shown in FIG. 5. As described supra, the channel impulse response is a mixed phase signal (i.e. maximum and minimum phase), therefore, in order to determine the minimum phase representation of the propagation path it must be extracted (i.e. deconvolved) from the complete impulse response.

Homomorphic deconvolution, as performed by block 70, comprises a transformation of the mixed phase signal from the discrete time domain to the cepstral domain (block 72), liftering (the term used for filtering in the cepstral domain) via multiplication 74 by a suitable filter (e.g., Hilbert transform filter) and inverse transformation back to the time domain (block 76) to yield the minimum phase function.

The cepstral transformation involves taking the Fourier transform, the logarithm of the result and than the inverse Fourier transform. The transformation of the mixed phase impulse response to the cepstral domain can be expressed as $$H_{MixPhase}(n) = f^{-1}\{\log|f\{h_{MixPhase}(n)\}|\} \quad (5)$$

wherein $f\{\cdot\}$ and $f^{-1}\{\cdot\}$ represent the Fourier transform and inverse Fourier transform, respectively. The signal in the cepstral domain is then "liftered" using a "lifter" that extracts the minimum phase portion of the impulse response as shown in FIG. 6 where $\hat{t}$ represents time in the cepstral domain. One of the benefits of processing in the cepstral domain is the relative ease with which the maximum phase portion 200 can be separated from the minimum phase portion 202.

A suitable filter comprises a Hilbert transform filter given by $$l_{Min} = 2u(n) - \delta(n) \quad (6)$$

where u(n) is the unit step function;

δ(n) is the Dirac delta function;

therefore $$H_{MinPhase}(n) = H_{MinPhase}(n) \cdot l_{Min}(n) \quad (7)$$

The minimum phase cepstral representation of the impulse response is then transformed back to the time domain via the inverse cepstral transform, which employs the Fourier transform, the exponential of the result and than the inverse Fourier transform as expressed below $$h_{MinPhase}(n) = f^{-1}\{e^{f(H_{MinPhase}(n))}\} \quad (8)$$

Figure 7:
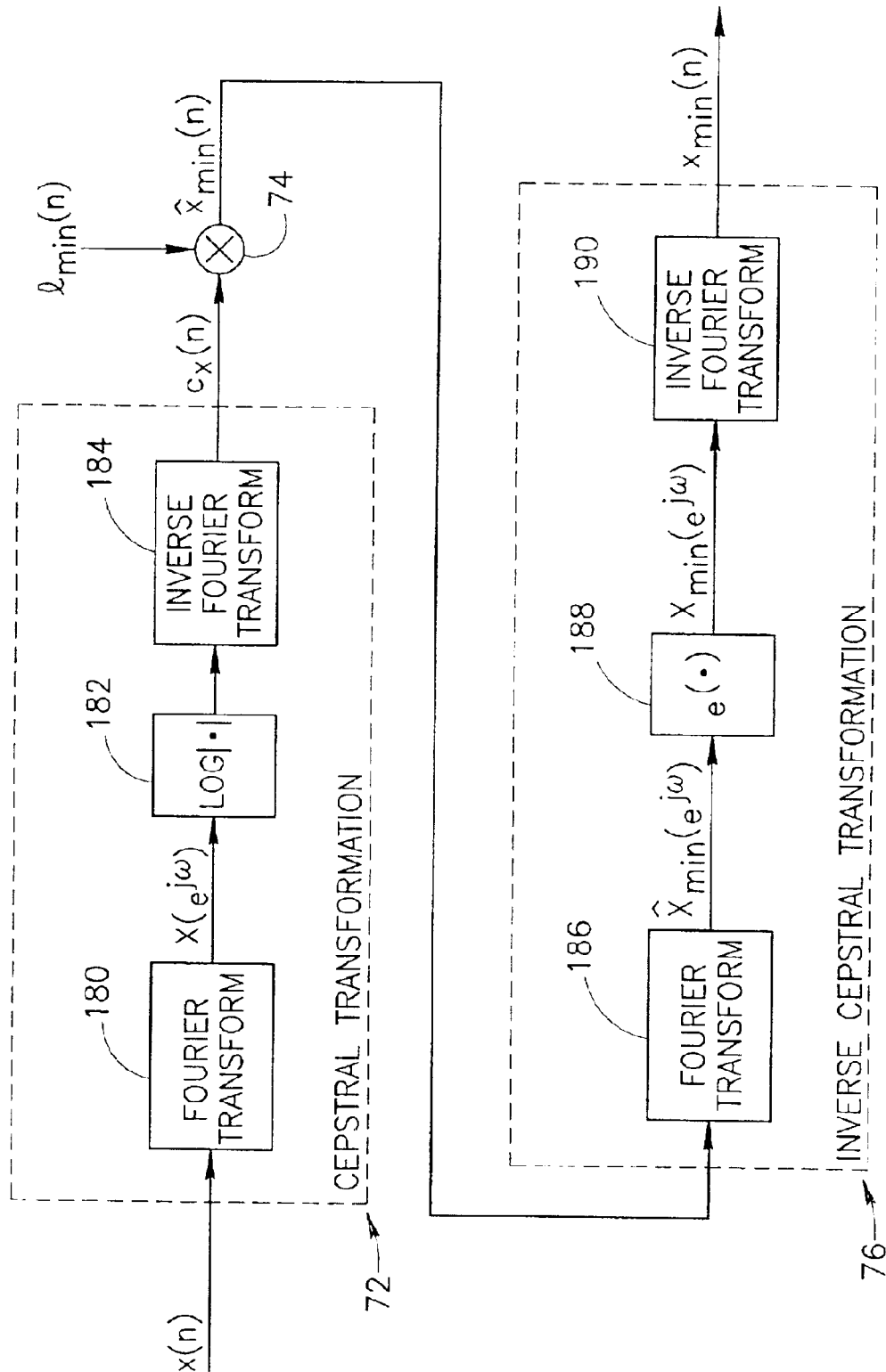
FIG. 7 is a block diagram illustrating the cepstral transformation and inverse cepstral transformation of the minimum phase extraction process of FIG. 5.

A block diagram illustrating the cepstral transformation and inverse cepstral transformation of the minimum phase extraction process of FIG. 5 is shown in FIG. 7. The cepstral transformation comprises a Fourier transform 180, logarithm 182 and inverse Fourier transform 184. The cepstral domain signal is then liftered via multiplier 74 and converted back to the time domain via an inverse cepstral transformation 76 comprising a Fourier transform 186, exponentiation 188 and inverse Fourier transform 190.

The mathematical analysis of the homomorphic deconvolution process will now be presented. Note that x[n] represents a mixed phase FIR system and $X_{min}$[n] represents a minimum phase FIR system. In order to simplify the analysis, two minor implementation modifications have been made to the original formulation given in FIG. 7. The first modification is that since processing performed by the invention is in the digital domain using digital hardware and/or software, the Fourier transforms have been replaced with discrete Fourier transforms (DFT) and inverse discrete Fourier transforms (IDFT). Both DFTs and IDFTs are implemented as Fast DFTs and fast IDFTs, hence FFTs and IFFTs.

The formulation for DFT and IDFT respectively are as follows $$DFT \equiv F\{x[n]\} \equiv X(e^{j\omega}) = \sum_{n=-\infty}^{\infty} x[n] \cdot e^{-j\omega n} \quad (9)$$

and $$IDFT \equiv F^{-1}\{X(e^{j\omega})\} \equiv x[n] = \sum_{n=-\infty}^{\infty} X(e^{j\omega}) \cdot e^{j\omega n} \quad (10)$$

The second modification involves the function $\log|x|$ in the forward cepstral transformation. Since $\log|x|^2$ (i.e. logarithm of the normal) is computationally cheaper than $\log|x|$ (i.e. logarithm of absolute value). Further, since $$I_{Min} = 2u(n) - \delta(n) \quad (6)$$

we thus have a factor of two multiplying the samples at a point in the computational flow. The multiplication by this factor is compensated for by changing the liftering function from that in Equation 6 to $$I_{Min} = u(n) - \tfrac{1}{2}\delta(n) \quad (11)$$

It is noted that there is very little actual multiplication in the "liftering" process as a result of this manipulation. In operation, half the samples are multiplied by zero and thus can be discarded and most of the other samples are multiplied by one and thus can be copied. Only a single sample at t=0 is multiplied by 0.5.

Fourier Transform $f\{\cdot\}$ (Block 180):

For purposes of the analysis we can express the Fourier transform as a product of zeros and gain as follows $$X(e^{j\omega}) = A \cdot e^{j\omega r} \cdot \prod_{k=1}^{M} (1 - a_k \cdot e^{-j\omega}) \cdot \prod_{k=1}^{N} (1 - b_k \cdot e^{j\omega}) \, |a_k|, |b_k| < 1 \quad (12)$$

In Equation 12 above it can be seen that the Fourier transform comprises M zeros of minimum phase and N zeros of maximum phase. The process of arriving at this expression is described below.

Let $a_k$ and $b_k^{-1}$ be the zero placements of the transfer function inside and outside the unit circle, respectively ($|a_k|,|b_k|<1$). The z-domain transfer function can be expressed as $$X(z) = A' \cdot \prod_{k=1}^{M} (z - a_k) \cdot \prod_{k=1}^{N} (z - b_k^{-1}) = \quad (13)$$

$$A' \cdot z^{M+N} \cdot \prod_{k=1}^{M} (1 - a_k z^{-1}) \cdot \prod_{k=1}^{N} (1 - (b_k z)^{-1})$$

Multiplying this expression by $$\frac{\prod_{k=1}^{N} (-(b_k z)^{-1})}{\prod_{k=1}^{N} (-(b_k z)^{-1})} \equiv 1 \quad (14)$$

yields $$X(z) = \left\{ A' \cdot \prod_{k=1}^{N} b_k \cdot (-1)^N \right\} \cdot z^{M+2N} \cdot \prod_{k=1}^{M} (1 - a_k z^{-1}) \cdot \prod_{k=1}^{N} (1 - b_k z) \quad (15)$$

Replacing A for the term in braces and setting r=M+2N yields the z-transform version of Equation 12.

Logarithm $\log|x|^2$ (Block 182):

The norm of the transfer function is given by $$|X(e^{j\omega})|^2 = |A|^2 \cdot \prod_{k=1}^{M} [(1 - a_k \cdot e^{-j\omega}) \cdot (1 - a_k^* \cdot e^{j\omega})] \cdot \quad (16)$$

$$\prod_{k=1}^{N} [(1 - b_k \cdot e^{j\omega}) \cdot (1 - b_k^* \cdot e^{-j\omega})]$$

Taking the log of the norm yields $$\text{Log}(|X(e^{j\omega})|^2) = \text{Log}\left\{ |A|^2 \cdot \prod_{k=1}^{M} [(1 - a_k \cdot e^{-j\omega}) \cdot (1 - a_k^* \cdot e^{j\omega})] \cdot \right. \quad (17)$$

$$\left. \prod_{k=1}^{N} [(1 - b_k \cdot e^{j\omega}) \cdot (1 - b_k^* \cdot e^{-j\omega})] \right\} =$$

$$\text{Log}|A|^2 + \sum_{k=1}^{M} [\text{Log}(1 - a_k \cdot e^{-j\omega}) + \text{Log}(1 - a_k^* \cdot e^{j\omega})] +$$

$$\sum_{k=1}^{N} [\text{Log}(1 - b_k \cdot e^{j\omega}) + \text{Log}(1 - b_k^* \cdot e^{-j\omega})]$$

The Taylor series for the log function is given as $$\text{Log}(1 - \alpha \cdot x^{-1}) = -\sum_{n=1}^{\infty} \frac{\alpha^n}{n} \cdot x^{-n} \quad |x| > |\alpha| \quad (18)$$

$$\text{Log}(1 - \beta \cdot x) = -\sum_{n=1}^{\infty} \frac{\beta^n}{n} \cdot x^n \quad |x| < |\beta^{-1}|$$

Combining Equations 17 and 18 yields an expression for $\log|x|^2$ $$\log(|X(e^{j\omega})|^2) = \tag{19}$$

$$\log|A|^2 + \sum_{k=1}^{M}\left[-\sum_{n=1}^{\infty}\frac{(a_k)^n}{n}\cdot e^{-j\omega n} - \sum_{n=1}^{\infty}\frac{(a_k^*)^n}{n}\cdot e^{j\omega n}\right] +$$

$$\sum_{k=1}^{N}\left[-\sum_{n=1}^{\infty}\frac{(b_k)^n}{n}\cdot e^{j\omega n} - \sum_{n=1}^{\infty}\frac{(b_k^*)^n}{n}\cdot e^{-j\omega n}\right]$$

Inverse Fourier Transform $f^{-1}\{\ \}$ (Block 184):

In this processing block, we take the inverse Fourier transform of the $\log|x|^2$ output of block 182 as follows $$F^{-1}\{\log(|X(e^{j\omega})|^2)\} = \tag{20}$$

$$\begin{cases} \log|A|^2 + \\ \sum_{k=1}^{M}\left[-F^{-1}\left\{\sum_{n=1}^{\infty}\frac{(a_k)^n}{n}\cdot e^{-j\omega n}\right\} - F^{-1}\left\{\sum_{n=1}^{\infty}\frac{(a_k^*)^n}{n}\cdot e^{j\omega n}\right\}\right] + \\ \sum_{k=1}^{N}\left[-F^{-1}\left\{\sum_{n=1}^{\infty}\frac{(b_k)^n}{n}\cdot e^{j\omega n}\right\} - F^{-1}\left\{\sum_{n=1}^{\infty}\frac{(b_k^*)^n}{n}\cdot e^{-j\omega n}\right\}\right] \end{cases}$$

The inverse Fourier transforms of the lower two expression are as follows $$F^{-1}\left\{\sum_{n=1}^{\infty}\frac{\alpha^n}{n}\cdot e^{-j\omega n}\right\} = \frac{\alpha^n}{n}\ \ n\geq 1 \tag{21}$$

$$F^{-1}\left\{\sum_{n=1}^{\infty}\frac{\beta^n}{n}\cdot e^{j\omega n}\right\} = F^{-1}\left\{-\sum_{n=-\infty}^{-1}\frac{\beta^{-n}}{n}\cdot e^{-j\omega n}\right\} = -\frac{\beta^{-n}}{n}\ \ n\leq -1$$

Inserting the results of Equation 21 into Equation 20 yields $$F^{-1}\{\log(|X(e^{j\omega})|^2)\} = \begin{cases} 2\cdot\log|A| & n=0 \\ \sum_{k=1}^{M}\frac{(a_k)^n}{n} + \sum_{k=1}^{N}\frac{(b_k^*)^n}{n} & n\geq 1 \\ -\sum_{k=1}^{M}\frac{(a_k^*)^{-n}}{n} - \sum_{k=1}^{N}\frac{(b_k)^{-n}}{n} & n\leq -1 \end{cases} \tag{22}$$

It is important to note that after examining Equation 22, it is clear that the taps for n>0 are the minimum phase taps and the taps for n<0 are the maximum phase taps of the representation of the impulse response in the cepstral domain.

Liftering by $I_{min}$ (Block 74):

During this step the minimum phase taps are selected by filtering the taps for n>0 and the zero tap with a factor of 2.

$$y[n] = F^{-1}\{\log(|X(e^{j\omega})|^2)\}\cdot\left[u[n] - \frac{1}{2}\cdot\delta[n]\right] = \tag{23}$$

$$\log|A|\cdot\delta[n] + \left[\sum_{k=1}^{M}\frac{(a_k)^n}{n} + \sum_{k=1}^{N}\frac{(b_k^*)^n}{n}\right]\cdot u[n]$$

Inverse Fourier Transform $f\{\ \}$ (Block 186):

The Fourier transform of y[n] yields $$Y(e^{j\omega}) = \log|A| + \sum_{k=1}^{M}\sum_{n=1}^{\infty}\frac{(a_k)^n}{n}\cdot e^{-j\omega n} + \sum_{k=1}^{N}\sum_{n=1}^{\infty}\frac{(b_k^*)^n}{n}\cdot e^{-j\omega n} \tag{24}$$

Replacing the Taylor series equations with the Log function results in $$Y(e^{j\omega}) = \log|A| + \sum_{k=1}^{M}\log(1 - a_k\cdot e^{-j\omega}) + \sum_{k=1}^{N}\log(1 - b_k^*\cdot e^{-j\omega}) \tag{25}$$

Exponentiation $e^x$ (Block 188):

Taking the inverse function of Log (i.e. exponentiation) yields $$X_{min}(e^{j\omega}) = e^{Y(e^{j\omega})} = |A|\cdot\prod_{k=1}^{M}(1 - a_k\cdot e^{-j\omega})\cdot\prod_{k=1}^{N}(1 - b_k^*\cdot e^{-j\omega}) \tag{26}$$

Note that for simplicity sake the natural logarithm was used. Thus, its inverse function is the exponent $e^x$.

Inverse Fourier Transform $f^{-1}\{\ \}$ (Block 190):

At this point the Fourier transform of the minimum phase has been calculated. To generate the minimum phase representation in the time domain the inverse Fourier transform is applied as follows $$F\{X_{min}(e^{j\omega})\} = x_{min}[n] \tag{27}$$

Note that, alternatively, any other logarithm base can be used in performing homomorphic deconvolution using the cepstral transformation technique described above.

Thus, in accordance with the invention, the homomorphic deconvolution technique described above is used to derive the minimum phase portion of the channel impulse response as performed by block 70 (FIG. 4).

Note also that the homomorphic deconvolution technique described above is used to derive the maximum phase portion of the channel impulse response as performed by block 58 (FIG. 3). The difference being that the maximum phase rather than the minimum phase portion is extracted.

Receiver Operation with Whitening Matched Filter

Once the minimum phase transfer function is calculated, it is used to implement the whitening filter shown as blocks 66/68 (FIG. 4). The WMF 60 is operative to filter the received samples before they are processed by the equalizer. In addition, the WMF is operative to generate a minimum phase version of the channel impulse response which is subsequently used by the equalizer. In operation, the input samples are reversed in time via time reversal block 62, processed by the matched filter 64 followed with processing by the whitening filter (blocks 66/68). Normal time is restored by a second time reversal block 69 which outputs the filtered samples.

Note that the optional post sampling filter (i.e. compensation filter) 30 (FIG. 1) can be used to improve the performance of the receiver. A post sampling filter and associated interference reduction mechanism suitable for use with the present invention is described in detail in U.S. Pat. No. 6,470,047 to Kleinerman et al., entitled "Apparatus For And Method Of Reducing Interference In A Communications Receiver," incorporated herein by reference in its entirety.

In the case where a post sampling filter is used to compensate the input samples for the transmit filter, channel and receive filter, the input to the WMF comprises the samples output of the post sampling filter. The WMF then processes the samples using the minimum phase transfer function derived using cepstral techniques as described supra.

Figure 8:
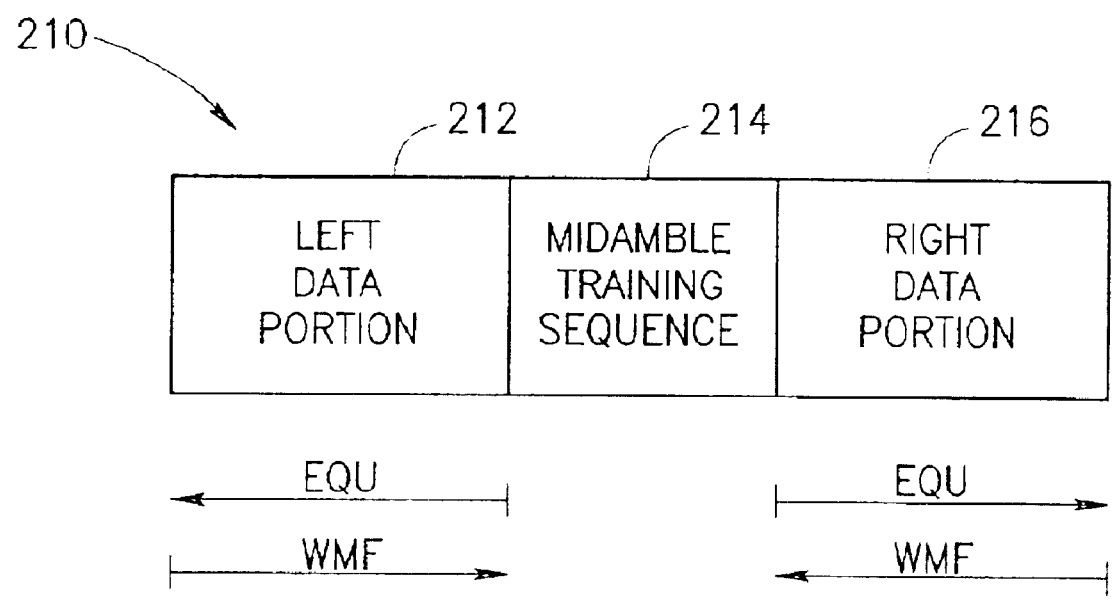
FIG. 8 is a diagram illustrating an example message comprising a midamble training sequence and left and right data portions.

In accordance with a key aspect of the present invention, the WMF processing is performed in a time reversed direction relative to the equalizer processing. A generic message, generally reverenced 210, is shown in FIG. 8 comprising a midamble training sequence 214, a left data portion 212 and a right data portion 216. The right hand data portion, comprises data received after the training sequence, is processed by the WMF in the reverse time direction from the last sample in the buffer to the first sample after the training sequence midamble (as indicated by the oppositely pointing arrows). Equalization processing is performed in the normal time (i.e. forward time) direction running from a known initial state at the first sample after the training sequence midamble to the last sample in the right hand data portion.

The left hand data portion, comprising data received after the training sequence, is processed by the WMF in the normal (or forward) time direction from the first sample in the buffer to the last sample in the left data portion before the training sequence midamble in normal time. Equalization processing is performed on the left group of data symbols running from a known initial state next to the training sequence midamble to the first sample in the buffer in a reverse time direction.

Thus, in processing both left and right hand data portions, the whitening filter portion of the WMF of the present invention effectively applies a filter whose transfer function effectively cancels the non-minimum phase components of the signal by processing the samples in the reverse time direction with respect to the equalizer processing (i.e. in the anti-causal direction with respect to the equalizer processing) using the minimum phase impulse response.

WMF processing of the left hand data portion effectively applies a substitute IIR filter having an inverse minimum phase impulse response in normal time while equalization on the left hand data portion is performed in the time reversed direction. WMF processing of the right hand data portion effectively applies the same substitute IIR filter having an inverse minimum phase impulse response in the reverse time direction while equalization is performed on the right hand data portion in the normal or forward time direction.

It is important to note that the transfer function having an inverse minimum phase impulse response used in the WMF of the present invention can be implemented using either an IIR or a FIR type digital filter. This is due to the processing of the samples in the reverse direction of equalizer processing for both left and right hand data portions of the sample buffer. It is noted that use of an IIR filter for the implementation of the WMF is preferred since such a filter provides an exact solution of the transfer function having an inverse minimum phase impulse response, thus improving the performance of the receiver. Additional benefits of the use of an IIR filter include fewer complex number computations due to a fewer number of filter taps, less memory required and less computing resources required for the same performance as compared with an FIR filter.

Thus two alternatives in terms of time processing for implementing the WMF of the present invention include: (1) FIR filtering only (due to stability problems otherwise) in forward time relative to equalize processing using inverse maximum phase impulse response sequence (as illustrated in FIG. 3); or (2) FIR or IIR filtering in reverse time relative to equalizer processing using inverse minimum phase impulse response sequence (as illustrated in FIG. 4).

As described infra in connection with FIG. 1, the channel estimate is performed on the samples received over the channel. The results of the channel estimate are used by the post sampling filter, WMF and equalizer. Alternatively, the accuracy of the WMF processing can be improved by performing a second channel estimate after the post sampling filter. The input to this second channel estimate comprises the compensated samples output of the post sampling filter. Any suitable channel estimate technique such as those described supra may be used to implement the second channel estimation.

It is therefore a key advantage of the whitening matched filtering of the present invention to use the minimum phase sequence deconvolution technique of the present invention is that the process has a low computational complexity and involves a constant number of computations. This is in contrast to the prior art techniques that involve open ended iterative search techniques with potentially large computational complexity.

GSM EDGE Embodiment

Figure 9:
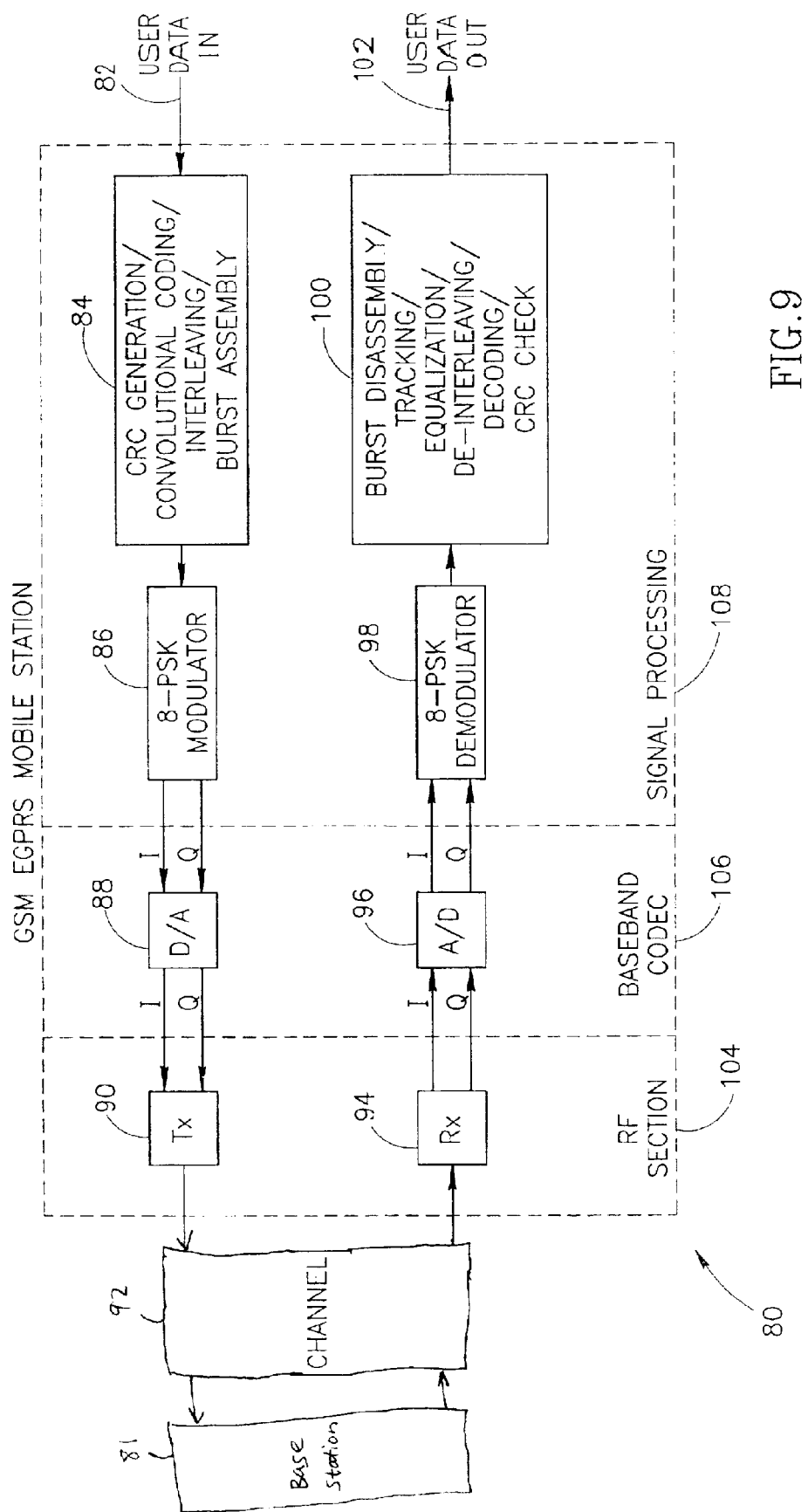
FIG. 9 is a block diagram illustrating the functional processing blocks in a GSM EDGE mobile radio station.

A GSM Enhanced General Packet Radio System (EGPRS) mobile station constructed to perform the whitening matched filter method of the present invention is presented. A block diagram illustrating the functional processing blocks in a GSM EGPRS mobile radio station is shown in FIG. 9. The EGPRS system is a Time Division Multiple Access (TDMA) system wherein eight users are able to share the same carrier frequency.

The GSM EGPRS mobile station, generally referenced 80, comprises a transmitter and receiver divided into the following sections: signal processing circuitry 108, baseband codec 106 and RF circuitry section 104.

Figure 10:
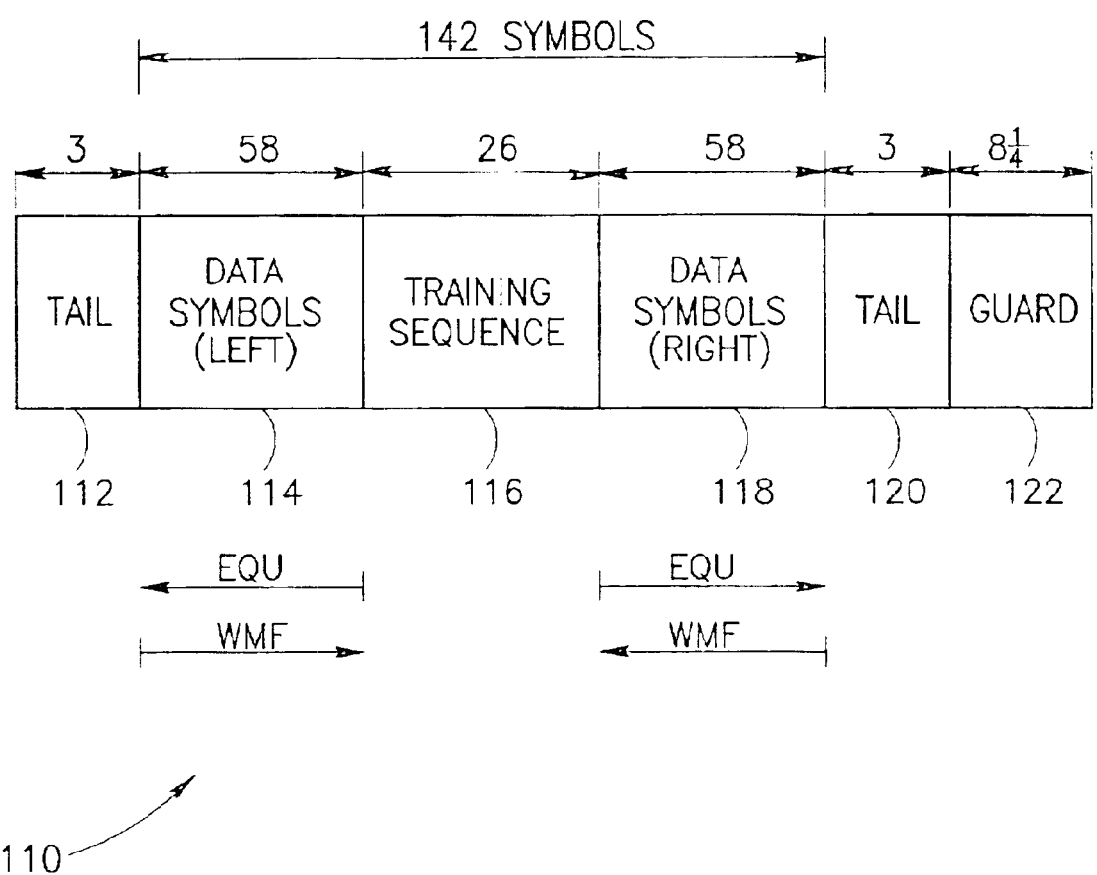
FIG. 10 is a diagram illustrating the elements of a GSM message including tail, data and training symbols.

In the transmit direction, the signal processing portion functions to protect the data so as to provide reliable communications from the transmitter to the base station 81 over the channel 92. Several processes performed by the channel coding block 84 are used to protect the user data 82 including cyclic redundancy code (CRC) check, convolutional coding, interleaving and burst assembly. An EGPRS radio station is designed to provide reliable data communications at rates of up to 480 kbit/s. In the transmitter, the data bits are encoded with a rate $1/3$ convolutional encoder, interleaved and mapped to 8-ary symbols. The resultant data is assembled into bursts of 142 symbols as shown in FIG. 10. Head and tail (i.e. guard) symbols are added in addition to a training sequence midamble that is added to the middle of the burst. Note that both the user data and the signaling information go through similar processing. The assembled burst is then differentially encoded and modulated in accordance with the GSM standard by a modulator 85 which may be implemented as a $3\pi/8$ offset 8-PSK modulator or $\pi/2$ offset GMSK modulator.

In GSM, the training sequence is sent in the middle of each burst. Each fixed length burst 110 consists of 142 symbols preceded by a 3 symbol tail 112 and followed by a 3 symbol tail 120 and 8.25 symbol guard 122. The 142 symbols include a 58 symbol left data portion 114, 26 symbol training sequence 116 and another 58 symbol right data portion 118. Since the training sequence is sent in the middle of the burst, it is referred to as a midamble. It is inserted in the middle of the burst in order to minimize the maximum distance to a data bit thus minimizing the time varying effects at the ends of the burst.

In the receive direction, the output of the baseband codec is demodulated using a complementary demodulator 98. Several processes performed by the channel decoding block 100 in the signal processing section 108 are then applied to the demodulated output. The processes performed include burst disassembly, whitening matched filtering in accordance with the present invention, equalization, de-interleaving, convolutional decoding and CRC check. Depending on the particular implementation, soft symbol generation and soft symbol to soft bit conversion may optionally be performed.

The baseband codec converts the transmit and receive data into analog and digital signals, respectively, via D/A converter 88 and A/D converter 96. The transmit D/A converter provides analog baseband I and Q signals to the transmitter 90 in the RF circuitry section. The I and Q signals are used to modulate the carrier for transmission over the channel.

In the receive direction, the signal transmitted by the base station over the channel is received by the receiver circuitry 94. The analog signals I and O output from the receiver are converted back into a digital data stream via A/D converter 96. This I and O digital data stream is filtered and demodulated by the demodulator 98 before being input to the channel decoding block 100. Several processes performed by signal processing block 108 are then applied to the demodulated output as described supra.

In addition, the mobile station performs other functions that may be considered higher level such as synchronization, frequency and time acquisition and tracking, monitoring, measurements of received signal strength and control of the radio. Other functions include handling the user interface, signaling between the mobile station and the network, the SIM interface, etc.

In the receiver, the GSM burst is processed as described above in connection with the generic message shown in FIG. 8. In particular, in accordance with the present invention, the WMF processing is performed in a direction opposite to that of the equalizer. With reference to the GSM message burst of FIG. 10, the right hand data portion, comprising data received after the training sequence, is processed by the WMF in the reverse time direction from the last sample in the buffer to the first sample after the training sequence midamble. Equalization processing is performed in the normal time (i.e. forward time) direction running from a known initial state at the first sample after the training sequence midamble to the last sample in the right hand data portion.

The left hand data portion, however, comprising data received before the training sequence, is processed by the WMF in the normal (or forward) time direction from the first sample in the buffer to the last sample in the left data portion before the training sequence midamble in normal time. Equalization processing is performed on the left group of data symbols running from a known initial state next to the training sequence midamble to the first sample in the buffer in a reverse time direction.

This effectively applies an inverse minimum phase filter to the input samples by using a minimum phase transfer function and processing the samples in the reverse time direction with respect to the equalizer processing.

Computer Embodiment

Figure 11:
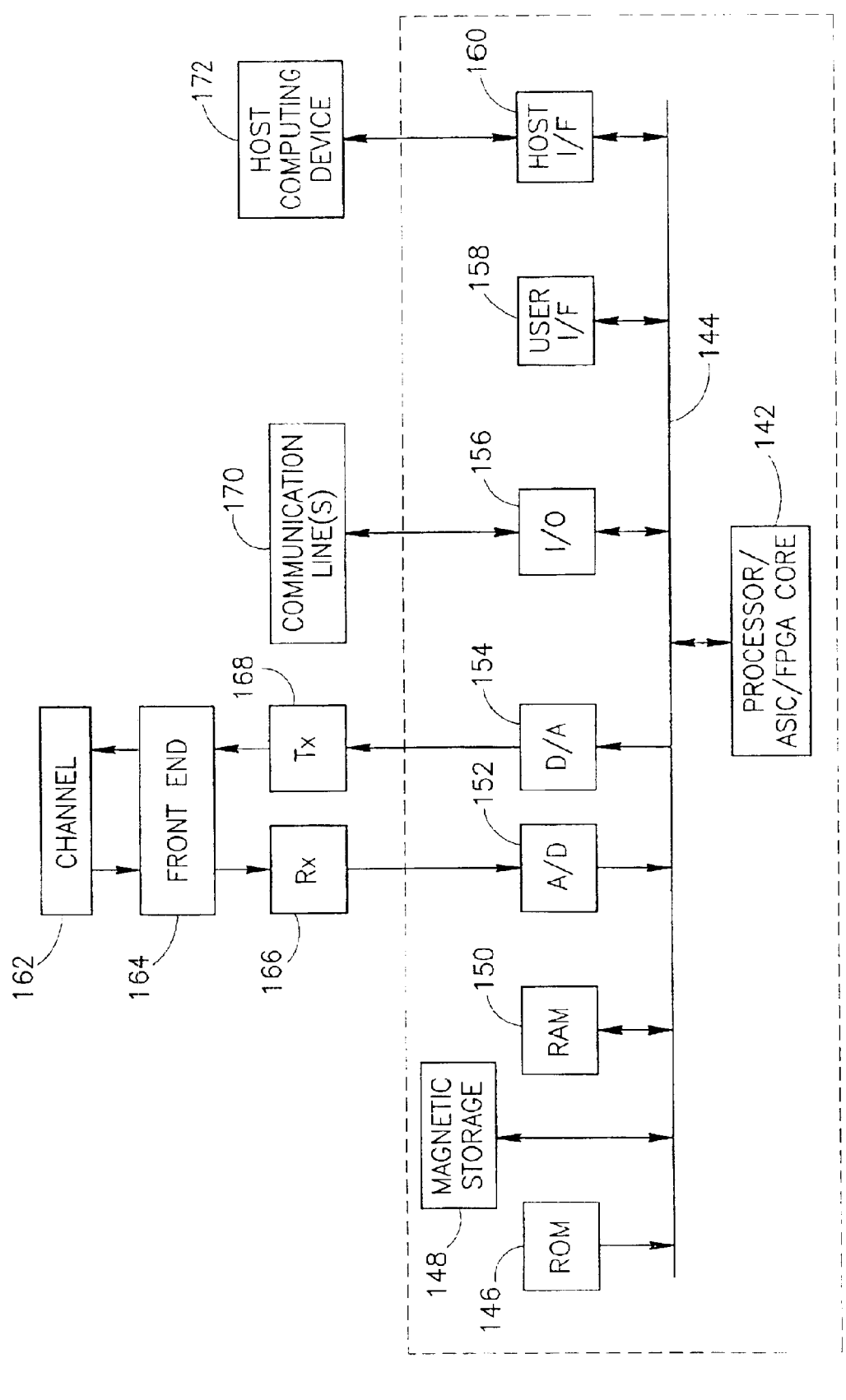
FIG. 11 is a block diagram illustrating an example computer processing system adapted to implement the whitening matched filter of the present invention.

In alternative embodiments, the present invention may be applicable to implementations of the invention in integrated circuits or chip sets, wired or wireless implementations, switching system products and transmission system products. For example, a computer is operative to execute software adapted to implement the whitening matched filter of the present invention. A block diagram illustrating an example computer processing system adapted to implement the whitening matched filter of the present invention is shown in FIG. 11. The system may be incorporated within a communications device such as a receiver, some or all of which may be implemented in software.

The computer system, generally referenced 140, comprises a processor 142 which may include a digital signal processor (DSP), central processing unit (CPU), microcontroller, microprocessor, microcomputer or ASIC core. The system also comprises static read only memory 146 and dynamic main memory 150 all in communication with the processor. The processor is also in communication, via a bus 144, with a number of peripheral devices that are also included in the computer system.

In the receive direction, signals received over the channel 162 are first input to the RF front end circuitry 164 which comprises a receiver section 166 and a transmitter section 168. Baseband samples of the received signal are generated by the A/D converter 152 and read by the processor. Baseband samples generated by the processor are converted to analog by D/A converter 154 before being input to the transmitter 168 for transmission over the channel via the RF front end.

One or more communication lines 170 are connected to the system via I/O interface 156. A user interface 158 responds to user inputs and provides feedback and other status information. A host interface 160 connects a host device 172 to the system. The host is adapted to configure, control and maintain the operation of the system. The system also comprises magnetic storage device 148 for storing application programs and data. The system comprises computer readable storage medium that may include any suitable memory means, including but not limited to, magnetic storage, optical storage, semiconductor volatile or non-volatile memory, biological memory devices, or any other memory storage device.

The whitening matched filter software is adapted to reside on a computer readable medium, such as a magnetic disk within a disk drive unit. Alternatively, the computer readable medium may comprise a floppy disk, removable hard disk, Flash memory card, EEROM based memory, bubble memory storage, ROM storage, etc. The software adapted to implement the whitening matched filter of the present invention may also reside, in whole or in part, in the static or dynamic main memories or in firmware within the processor of the computer system (i.e. within microcontroller, microprocessor or microcomputer internal memory).

In alternative embodiments, the whitening matched filter method of the present invention may be applicable to implementations of the invention in integrated circuits, field programmable gate arrays (FPGAs), chip sets or application specific integrated circuits (ASICs), wired or wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of whitening matched filtering a plurality of received samples in a receiver coupled to a channel having a mixed phase channel impulse response, said method comprising the steps of:

generating a whitening matched filter transfer function that includes a minimum phase channel impulse response and a matched filter response derived from said mixed phase channel impulse response; and processing said received samples in accordance with said whitening matched filter transfer function in reverse time order with respect to equalizer processing subsequently performed.

2. The method according to claim 1, further comprising the step of post sampling filtering said receiving samples before whitening filtering is performed.

3. The method according to claim 2, further comprising the steps of:

computing a first channel estimate for use by said post sampling filtering; and computing a second channel estimate for use by said whitening filtering after said post sampling filtering is complete.

4. The method according to claim 1, wherein said step of processing comprises the step of filtering said received samples using an infinite impulse response (IIR) filter having a transfer function equal to said whitening matched filter transfer function.

5. The method according to claim 1, wherein said step of processing comprises the step of filtering said received samples using a finite impulse response (FIR) filter having a transfer function equal to said whitening matched filter transfer function.

6. An electronic data storage media storing a computer program adapted to program a computer to execute the whitening matched filtering method of claim 1.

7. A method of whitening matched filtering a plurality of received samples received over a channel, said channel having a mixed phase channel impulse response, said method comprising the steps of:

generating a whitening matched filter transfer function that includes a minimum phase channel impulse response and a matched filter response, said minimum phase channel impulse response derived from said mixed phase channel impulse response in accordance with homomorphic deconvolution employing cepstral transformation techniques;

processing said received samples in accordance with said whitening matched filter transfer function in reverse time order with respect to equalizer processing subsequently performed;

processing samples received before a known training sequence in accordance with said whitening matched filter transfer function in forward time order; and processing samples received after said known training sequence in accordance with said minimum phase channel impulse response in reverse time order.

8. The method according to claim 7, wherein the minimum phase channel impulse response is generated by the steps of:

converting said mixed phase channel impulse response from discrete time domain to cepstral domain using a cepstral transformation to generate a cepstral domain signal;

liftering said cepstral domain signal by removing all portions other than the minimum phase portion of said cepstral domain signal to produce a minimum phase cepstral representation of said channel impulse response;

converting said minimum phase cepstral domain signal back to the discrete time domain from the cepstral domain to yield the time domain representation of the minimum phase channel impulse response.

9. The method according to claim 8, wherein said mixed phase channel impulse response is converted from the discrete time domain to the cepstral domain by cepstral transformation comprising the steps of:

calculating the Fourier transform of said mixed phase channel impulse response;

calculating the logarithm of said Fourier transform; and calculating the inverse Fourier transform of said logarithm to yield said cepstral domain signal.

10. The method according to claim 8, wherein said step of liftering comprises the step of minimum phase decomposition of said cepstral domain signal.

11. The method according to claim 8, wherein said step of liftering comprises the step of filtering said cepstral domain signal using a Hilbert transform filter expressed as $$l_{min}=2u(n)-\delta(n)$$

resulting in $$H_{minphase}=H_{mixphase} \cdot l_{min}(n)$$

wherein $H_{MinPhase}$, $H_{MixPhase}$ are the minimum and mixed phase cepstral representation of the channel impulse response.

12. The method according to claim 8, wherein said minimum phase cepstral domain signal is converted back to the discrete time domain by inverse cepstral transformation comprising the steps of:

calculating the Fourier transform of said minimum phase cepstral domain signal;

calculating the exponent of said Fourier transform; and calculating the inverse Fourier transform of said exponent to yield said time domain representation of the minimum phase channel impulse response.

13. The method according to claim 7, wherein said channel impulse response comprises the overall response of a transmit filter, fading channel, receive filter and a pre-channel estimation filter.

14. A method of whitening matched filtering an input signal received over a channel, said channel having a mixed phase channel impulse response, said method comprising the steps of:

generating a whitening matched filter transfer function of the form $$H_{WMF}(z) = \frac{H_{MP}(z)}{H_{WP}(z)}$$

that includes a matched filter response $H_{MF}(z)$ concatenated with a whitening filter response $H_{MF}(z)$ that includes a minimum phase channel impulse response, said minimum phase channel impulse response derived from said mixed phase channel impulse response, said matched filter response derived from the time reversed complex conjugate of said channel impulse response expressed in the equation $h_{MF}(t)=h^*_{CIR}(-t)$, wherein matched filtering is performed in the anti-causal direction on said input signal; and processing said received samples using a filter with said whitening matched filter transfer function in reverse time order with respect to equalizer processing subsequently performed on received samples.

15. The method according to claim 14, wherein said minimum phase channel impulse response is generated from said mixed phase channel impulse response by the steps of:
  converting said mixed phase channel impulse response from discrete time domain to cepstral domain using a cepstral transformation so as to generate a cepstral domain signal;
  liftering said cepstral domain signal by removing all portions other than the minimum phase portion of said cepstral domain signal to produce a minimum phase cepstral representation of said channel impulse response; and
  converting said minimum phase cepstral domain signal back to the discrete time domain from the cepstral domain to yield the time domain representation of the minimum phase channel impulse response.

16. The method according to claim 15, wherein said mixed phase channel impulse response is converted from the discrete time domain to the cepstral domain by cepstral transformation comprising the steps of:
  calculating the Fourier transform of said mixed phase channel impulse response;
  calculating the logarithm of said Fourier transform; and
  calculating the inverse Fourier transform of said logarithm to yield said cepstral domain signal.

17. The method according to claim 15, wherein said step of liftering comprises the step of minimum phase decomposition of said cepstral domain signal.

18. The method according to claim 15, wherein said step of liftering comprises the step of filtering said cepstral domain signal using a Hilbert transform filter expressed as $$I_{min}=2u(n)-\delta(n)$$

resulting in $$H_{minphase}=H_{mixphase} \cdot i_{min}(n)$$

where $H_{MinPhase}$, $H_{MaxPhase}$ are the minimum and mixed phase cepstral representation of the channel impulse response, respectively.

19. The method according to claim 15, wherein said minimum phase cepstral domain signal is converted back to the discrete time domain by inverse cepstral transformation comprising the steps of:
  calculating the Fourier transform of said minimum phase cepstral domain signal;
  calculating the exponent of said Fourier transform; and
  calculating the inverse Fourier transform of said exponent to yield said time domain representation of the minimum phase channel impulse response.

20. The method according to claim 14, wherein said mixed channel impulse response comprises the overall response of a transmit filter, fading channel, receive filter and a pre-channel estimation filter.

21. The method according to claim 14, wherein said step of processing is performed in the digital domain using a digital implementation of said matched filter and said whitening filter.

22. A whitening matched filter for generating an output signal in response to an input signal received over a channel having a mixed phase channel impulse response, comprising:
  means for generating a whitening matched filter transfer function including a matched filter response and a minimum phase channel impulse response derived from said mixed phase channel impulse response; and
  a filter processing system adapted to process received samples in accordance with said whitening matched filter in reverse time order with respect to equalizer processing subsequently performed on the output of said whitened matched filter.

23. The filter according to claim 22, wherein said whitening matched filter comprises a transfer function $H_{WMF}(z)=H_{MF}(z)/H_{WF}(z)$, said whitening matched filter receiving as input, time reversed samples of said input signal, said whitening matched filter providing a filter output at each sample interval, wherein $H_{MF}(z)$ is the matched filter response and $H_{WF}(z)$ is a whitening filter response that includes said minimum phase channel impulse response.

24. The filter according to claim 22, wherein the matched filter response for non time reversed samples of said input signal is derived from the time reversed complex conjugate of said channel impulse response as expressed as $h_{MF}(t)=h^*_{CIR}(-t)$.

25. The filter according to claim 22, wherein the matched filter response for time reversed samples of said input signal is derived from the complex conjugate of said channel impulse response as expressed as $h_{MF}(t)=h^*_{CIR}(t)$.

26. The filter according to claim 22, wherein said means for generating a whitening matched filter transfer function comprises means operative to:
  convert said mixed phase channel impulse response from discrete time domain to cepstral domain using cepstral transformation so as to generate a cepstral domain signal;
  perform minimum phase decomposition on said cepstral domain signal so as to remove all portions other than the minimum phase portion of said cepstral domain signal; and
  convert said minimum phase cepstral domain signal back to the discrete time domain from the cepstral domain using inverse cepstral transformation to yield the time domain representation of the minimum phase channel impulse response.

27. The filter according to claim 26, wherein said minimum phase decomposition is performed using a Hilbert transform filter expressed as $$I_{min}=2u(n)-\delta(n)$$

resulting in $$H_{minphase}=H_{mixphase} \cdot i_{min}(n)$$

where $H_{MinPhase}$, $H_{MaxPhase}$ are the minimum and mixed phase cepstral representation of the channel impulse response.

28. The filter according to claim 22, wherein said channel impulse response comprises the overall response of a transmit filter, fading channel, receive filter and a pre-channel estimation filter.

29. The filter according to claim 22, wherein said whitening matched filter is implemented digitally and adapted to filter said input signal in the digital domain.

30. A communications receiver for receiving and decoding an M-ary signal transmitted over a channel having a mixed phase channel impulse response, comprising:
  a radio frequency (RF) front end circuit for receiving and converting said M-ary transmitted signal to a baseband signal;

a demodulator adapted to receive said baseband signal and to generate a received signal therefrom in accordance with the M-ary modulation scheme used to generate said transmitted signal;

a whitening matched filter for generating an output signal in response to said receive signal, said whitening matched filter implemented using a processor comprising software means operative to:

generate a whitening matched filter transfer function including a matched filter response and a minimum phase channel impulse response derived from said mixed phase channel impulse response using cepstral transformation techniques;

process samples received over said channel before and after a known training sequence in accordance with said whitening matched filter response in reverse time order with respect to equalizer processing subsequently performed; and said equalizer adapted to equalize the output of said whitening filter so as to generate a sequence of hard symbol decisions therefrom.

31. The receiver according to claim 30, wherein said communications receiver is adapted to receive and decode a Global System for Mobile Communication (GSM) Enhanced Data rates for GSM and TDMA/135 Evolution (EDGE) signal.

32. The receiver according to claim 30, wherein said communications receiver is adapted to receive and decode a Global System for Mobile Communication (GSM) Enhanced Data rates for GSM and TDMA/135 Evolution (EDGE) Radio Access Network (GERAN) system signal.

33. The receiver according to claim 30, wherein said M-ary symbol comprises an 8-PSK symbol.

34. The receiver according to claim 30, wherein said M-ary symbol comprises a Gaussian minimum shift keying (GMSK) symbol.

35. The receiver according to claim 30, wherein said equalizer comprises a Decision Feedback Equalizer (DFE).

36. The receiver according to claim 30, wherein said equalizer comprises a reduced state sequence equalizer (RSSH).

37. The receiver according to claim 30, wherein said software means is operative to:

convert said mixed phase channel impulse response from discrete time domain to cepstral domain using cepstral transformation so as to generate a cepstral domain signal;

perform minimum phase decomposition on said cepstral domain signal so as to remove all portions other than the minimum phase portion of said cepstral domain signal; and convert said minimum phase cepstral domain signal back to the discrete time domain from the cepstral domain using inverse cepstral transformation to yield the time domain representation of the minimum phase channel impulse response.

38. The receiver according to claim 37, wherein said minimum phase decomposition is performed using a Hilbert transform filter expressed as $$I_{min}=2u(n)-\delta(n)$$

resulting in $$H_{minphase}=H_{mixphase} \cdot i_{min}(n)$$

where $H_{MinPhase}$, $H_{MaxPhase}$ are the minimum and mixed phase cepstral representation of the channel impulse response.

39. The receiver according to claim 30, wherein said channel impulse response comprises the overall response of a transmit filter, fading channel, receive filter and a prechannel estimation filter.

40. The receiver according to claim 30, wherein said software means is operative to implement a matched filter cascaded with said whitening filter.

41. The receiver according to claim 30, further comprising a post sampling filter adapted to compensate said received samples before being input to said whitening filter.

42. The receiver according to claim 41, further comprising:

a first channel estimation unit adapted to compute a first channel estimate for use by said post sampling filter; and a second channel estimation unit adapted to compute a second channel estimate for use by said whitening filtering after post sampling filtering is complete.

43. The receiver according to claim 30, wherein said samples received over said channel before said known training sequence are filtered using an infinite impulse response (IIR) filter having a transfer function equal to said whitening matched filter response.

44. The receiver according to claim 30, wherein said samples received over said channel after said known training sequence are filtered using an infinite impulse response (IIR) filter having a transfer function equal to said whitening matched filter response.

45. A computer readable storage medium having a computer program embodied thereon for causing a suitably programmed system to perform whitening matched filtering on an input signal received over a channel having a mixed phase channel impulse response by performing the following steps when such program is executed on said system:

generating a whitening matched filter transfer function incorporating a minimum phase channel impulse response and a matched filter response derived from said mixed phase channel impulse response; and processing said received samples in accordance with said whitening matched filter transfer function in reverse time order with respect to equalizer processing performed subsequent to said whitening matching filtering.

46. The computer readable storage medium according to claim 45, further comprising the step of post sampling filtering said receiving samples before whitening filtering is performed.

47. The computer readable storage medium according to claim 46, further comprising the steps of:

computing a first channel estimate for use by said post sampling filtering; and computing a second channel estimate for use by said whitening filtering after said post sampling filtering is complete.

48. The computer readable storage medium according to claim 45, wherein said step of processing comprises the step of filtering said input signal using an infinite impulse response (IIR) filter having a transfer function equal to said whitening matched filter transfer function.

49. The computer readable storage medium according to claim 45, wherein said step of processing comprises the step of filtering said input signal using a finite impulse response (FIR) filter having a transfer function equal to said whitening matched filter transfer function.

50. The computer readable storage medium according to claim 45, wherein said minimum phase channel impulse response is generated by:

converting said mixed phase channel impulse response from discrete time domain to cepstral domain using a cepstral transformation so as to generate a cepstral domain signal;

liftering said cepstral domain signal by removing all portions other than the minimum phase portion of said cepstral domain signal to produce a minimum phase cepstral representation of said channel impulse response; and converting said minimum phase cepstral domain signal back to the discrete time domain from the cepstral domain to yield the time domain representation of the minimum phase channel impulse response.

51. The computer readable storage medium according to claim 50, wherein said step of converting said mixed phase channel impulse response comprises the steps of:

calculating the Fourier transform of said mixed phase channel impulse response;

calculating the logarithm of said Fourier transform; and calculating the inverse Fourier transform of said logarithm to yield said cepstral domain signal.

52. The computer readable storage medium according to claim 50, wherein said step of liftering comprises the step of minimum phase decomposition of said cepstral domain signal.

53. The computer readable storage medium according to claim 50, wherein said step of liftering comprises the step of filtering said cepstral domain signal using a Hilbert transform filter expressed as $$I_{min}=2u(n)-\delta(n)$$

resulting in $$H_{minphase}=H_{mixphase} \cdot l_{min}(n)$$

where $H_{MinPhase}$, $H_{MaxPhase}$ are the minimum and mixed phase cepstral representation of the channel impulse response, respectively.

54. The computer readable storage medium according to claim 50, wherein said step of converting said minimum phase cepstral domain signal comprises the steps of:

calculating the Fourier transform of said minimum phase cepstral domain signal;

calculating the exponent of said Fourier transform; and calculating the inverse Fourier transform of said exponent to yield said time domain representation of the minimum phase channel impulse response.

* * * * *